United States Patent
Bonanni et al.

(10) Patent No.: US 9,201,128 B2
(45) Date of Patent: Dec. 1, 2015

(54) SYSTEMS FOR PRODUCING PRECISION MAGNETIC COIL WINDINGS

(71) Applicant: General Electric Company, Schenectady, NY (US)

(72) Inventors: Pierino Gianni Bonanni, Loudonville, NY (US); Paul St. Mark Shadforth Thompson, Stephentown, NY (US); Martin Kin-Fei Lee, Niskayuna, NY (US); Christopher Darby Immer, Niskayuna, NY (US); Russell Stephen DeMuth, Berne, NY (US); Jonathan Sebastian Janssen, Regensburg (DE); Danny William Johnson, Niskayuna, NY (US); Evangelos Trifon Laskaris, Niskayuna, NY (US); Owen Scott Quirion, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 258 days.

(21) Appl. No.: 14/031,054

(22) Filed: Sep. 19, 2013

(65) Prior Publication Data

US 2015/0075670 A1    Mar. 19, 2015

(51) Int. Cl.
*B21D 17/02*    (2006.01)
*G01R 33/3815*    (2006.01)
(Continued)

(52) U.S. Cl.
CPC ............ *G01R 33/3815* (2013.01); *B21D 17/02* (2013.01); *B21D 37/16* (2013.01); *B21F 3/00* (2013.01); *B65H 54/00* (2013.01); *G01R 33/3802* (2013.01); *H01F 41/02* (2013.01)

(58) Field of Classification Search
CPC ........... G01R 33/3815; G01R 33/3802; B65H 54/00; H01F 41/02; B21D 37/16; B21D 17/02
USPC ........ 72/342.1, 342.94; 140/1, 71, 92.1, 92.2; 242/7.09, 7.08, 7.16, 476.6, 478.1, 242/483.3; 29/596, 605, 734, 868
See application file for complete search history.

(56) References Cited

U.S. PATENT DOCUMENTS 4,367,774 A * 1/1983 Arnold et al. ...................... 140/1
4,463,547 A * 8/1984 Young ................................ 57/6

(Continued)

FOREIGN PATENT DOCUMENTS

CN    201732680 U    2/2011

OTHER PUBLICATIONS

Srivastava, "Automatic Motor Winding Machine", National Innovation Foundation—India, An Autonomous Body of Department of Science and Technology, Govt. of India, Copyright © 2004-2011, 3 pages.

*Primary Examiner* — David B Jones
(74) *Attorney, Agent, or Firm* — Seems S. Katragadda

(57) ABSTRACT

A system for producing precision magnetic coil windings is provided. The system includes a wire disposing assembly having a support, an axial traverser sub-assembly, and a support arm. The support is configured to receive a plurality of turns of a wire. The axial traverser sub-assembly is operatively coupled to the support. The support arm includes a wire disposing device. The system further includes a linear stage, a monitoring unit, a feedback unit, and a controller unit. The linear stage is operatively coupled to the support arm. Moreover, the controller unit is configured to axially position an incoming portion of the wire and provide reference trajectories for tracking.

19 Claims, 18 Drawing Sheets

(51) Int. Cl.
*B65H 54/00* (2006.01)
*H01F 41/02* (2006.01)
*B21D 37/16* (2006.01)
*B21F 3/00* (2006.01)
*G01R 33/38* (2006.01)

(56) References Cited

U.S. PATENT DOCUMENTS

| | | | |
|---|---|---|---|
| 4,484,712 A * | 11/1984 | Leenders | 242/478.1 |
| 4,558,829 A | 12/1985 | Aretz et al. | |
| 4,589,602 A | 5/1986 | Reiners et al. | |
| 4,629,145 A * | 12/1986 | Graham | 242/483.3 |
| 4,699,184 A * | 10/1987 | Macemon et al. | 140/92.2 |
| 4,746,075 A | 5/1988 | Hoxit | |
| 4,901,773 A * | 2/1990 | Marshall et al. | 140/92.1 |
| 4,910,858 A | 3/1990 | Takeda et al. | |
| 5,301,884 A | 4/1994 | Horneman | |
| 5,397,070 A | 3/1995 | Yano | |
| 5,402,097 A | 3/1995 | Chou | |
| 6,295,720 B1 * | 10/2001 | Finn et al. | 29/605 |
| 6,519,832 B1 * | 2/2003 | DeHart | 29/596 |
| 7,246,767 B2 | 7/2007 | Castellani | |
| 7,673,488 B2 * | 3/2010 | Isayama et al. | 72/342.1 |

* cited by examiner

SYSTEMS FOR PRODUCING PRECISION MAGNETIC COIL WINDINGS

BACKGROUND

The invention relates to magnetic coil windings, and more particularly to precision magnetic coil windings and systems for producing the same.

High intensity, highly uniform magnetic fields are required for successful magnetic resonance imaging (MRI). The high intensity magnetic fields may be achieved using superconducting coils and cryogenic cooling. In some instances, to promote thermal and mechanical stability of such superconducting coils, it is desirable to support the wire within a layer of epoxy. The manufacture of these superconducting coils is subject to a high cost of superconducting wire and the relative difficulty of achieving consistency and uniformity in the distribution of the epoxy throughout the coil pack. Due to stringent electromagnetic requirements, and high thermal and mechanical stresses that pose a risk of magnet quench, it is desirable for these magnetic resonance (MR) coils to be free of defects such as gaps, ride-ups, drop-ins, and other anomalies. These cost and quality requirements constrain the manufacturing process to include precise control over the winding geometry, where it is desirable to form coils that consist of densely packed wire wound free of defects, while maintaining a precise layer by layer turn count.

Existing coil winding methods employ a winding machine in which the wire, maintained at constant tension, traverses linearly in a direction parallel to the axis of rotation of a spindle. In high precision applications involving small wire diameters and large coil diameters, absent the required degree of automatic control, operators may need to provide small-scale steering adjustments along with error detection and correction. However, manual correction is susceptible to human errors. Additionally, manual correction slows the process of coil winding.

Moreover, it may be noted that epoxy-supported coils are especially difficult to manufacture with precision. For example, the turns of a coil impregnated with epoxy may be difficult to place at the desired location, as the turns may slip from the desired location due to presence of the epoxy. Wet winding methods, in which the wire is coated with epoxy along the path to the winding bobbin, as opposed to being coated after winding, may be employed to maximize coverage of the epoxy. As will be appreciated, it is desirable to dispose the exact number of turns into the available space between the flanges of a winding bobbin and the correct nesting of wire between layers. Any substantial deviation of wire placement may accumulate during the winding process, and result in either insufficient space to place the desired number of turns, or extra space between turns, causing the next layer in the same location to ride up or drop in, respectively.

BRIEF DESCRIPTION

In one embodiment, a system for producing precision magnetic coil windings is provided. The system includes a wire disposing assembly having a support, an axial traverser sub-assembly, and a support arm. The support is configured to receive a plurality of turns of a wire. Further, the support is configured to rotate. The axial traverser sub-assembly is operatively coupled to the support. Further, a rate of motion of the axial traverser sub-assembly is coupled to a speed of rotation of the support. The support arm includes a wire disposing device configured to guide a portion of the wire being disposed on a surface of the support. The system further includes a linear stage, a monitoring unit, and a controller unit. The linear stage is operatively coupled to the support arm. Moreover, the controller unit is configured to axially position an incoming portion of the wire, wherein the controller unit is configured to provide reference trajectories for tracking.

In another embodiment, a system for producing precision magnetic coil windings is provided. The system includes a wire disposing assembly having a coil form, a frame, a radial positioning device, and a support arm. The frame is configured to house the coil form. Further, the radial positioning device is operatively coupled to the frame and the coil form. Furthermore, the radial positioning device is configured to maintain a determined distance from an end of the support arm to a surface of the coil form. The support arm includes a wire disposing device configured to dispose at least a portion of a wire of the precision magnetic coil windings at a determined position on the coil form. Additionally, the support arm includes a resin unit configured to dispose a determined amount of resin on at least a portion of the wire prior to the wire being disposed on the coil form. The system further includes a linear stage, a monitoring unit, and a controller unit. The linear stage is operatively coupled to the wire disposing device and the resin unit. Further, the monitoring unit includes a feedback unit operatively coupled to the wire disposing assembly and configured to provide feedback to the wire disposing assembly. Furthermore, the controller unit is operatively coupled to the wire disposing assembly and the feedback unit. Moreover, the controller unit is configured to control the wire disposing assembly.

DRAWINGS

These and other features and aspects of embodiments of the invention will become better understood when the following detailed description is read with reference to the accompanying drawings in which like characters represent like parts throughout the drawings, wherein.

DETAILED DESCRIPTION

Figure 1:
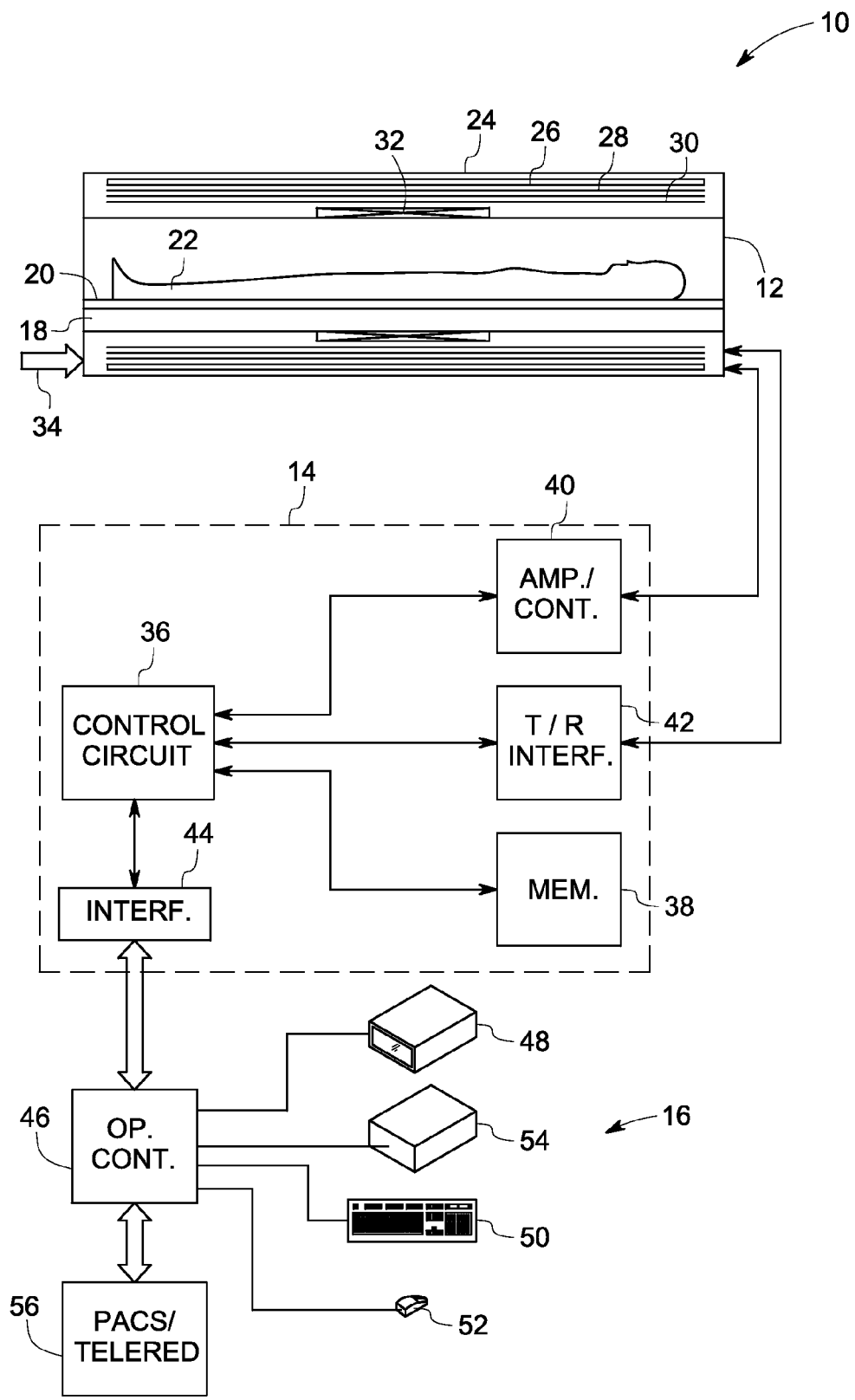
FIG. 1 is a block diagram of an example diagnostic system employing precision magnetic coil windings, in accordance with aspects of the present disclosure.

In certain embodiments, systems for automated coil winding are provided. In particular, systems for precision magnetic coil winding are provided. In precision coil winding, turns of each successive layer are disposed or nested in valleys between the close-wound turns of the preceding layer, thereby providing compact and economical packing. Advantageously, these systems facilitate reduction in winding defects while providing a time efficient winding process. By way of example, the systems require less time relative to manual or semi-automatic winding processes that employ an operator to identify or determine a defect during winding of the coil. In some embodiments, the systems may be configured to operate with minimal operator intervention. Advantageously, the systems are configured to guide wire placement and also correct wire placement in instances of defects encountered during winding of the coil.

Also, in certain embodiments, a system for producing precision magnetic coil windings includes a wire disposing assembly having a frame configured to house a support or a coil form and a radial positioning device. In the present application, the terms "support," "bobbin" and "coil form" may be used interchangeably. The radial positioning device is operatively coupled to the frame and the coil form. The system further includes a support arm having a wire disposing device and a resin unit. In one embodiment, the wire disposing device is configured to dispose at least a portion of a wire at a determined position on the coil form. In another embodiment, the resin unit is configured to dispose a determined amount of resin on at least a portion of the wire prior to the wire being disposed on the coil form. In some embodiments, the radial positioning device is configured to maintain a determined distance from an end of a support arm to a surface of the coil form. The system further includes a linear stage operatively coupled to the wire disposing device and the resin unit. In one embodiment, the linear stage may include one or more of an axial sensor, a radial sensor, a wire tension sensor, or combinations thereof. The sensors may be used to sense the position of the wire on the coil form as the winding progresses.

Furthermore, the system includes a monitoring unit and a controller unit. The monitoring unit includes a feedback unit that is operatively coupled to the wire disposing assembly to provide real-time feedback to the wire disposing assembly regarding the position of the wire. The controller unit is operatively coupled to the wire disposing assembly and the feedback unit. In one embodiment, the controller unit is configured to control the wire disposing assembly. By way of example, the controller unit is configured to adjust a positioning of the wire being wound on the coil form.

In certain embodiments, the feedback unit is configured to provide a real-time feedback of the position of the wire on the support, and a rotational position of the support. In one embodiment, the feedback unit includes a stage encoder, a wire position estimator, a wire profiler, or combinations thereof. In addition or as an alternative, the feedback unit includes a spindle encoder, where the spindle encoder is configured to provide data representative of an angular position of a spindle. In some embodiments, the monitoring unit includes one or more auxiliary sensors configured to sense one or more of a wire diameter, a wire length, a wire tension, or combinations thereof.

Moreover, in some embodiments, the wire disposing assembly may include the support or the coil form configured to receive a plurality of turns of a wire, where the support is configured to rotate. The assembly may further include an axial traverser sub-assembly configured to receive at least a portion of the wire from a supply source and transfer the received portion of the wire to the support. In one embodiment, the axial traverser sub-assembly is configured to dispose the wire in a form of a plurality of loops, where each loop includes a circular portion and a transition region, and where a plane of the circular portion of the loop is parallel to a cross-sectional plane of the support or the bobbin. In one embodiment, the axial traverser sub-assembly may be operatively coupled to the support. In some embodiments, the assembly may further include a linear stage. The linear stage may be configured to move the support arm in a desirable linear direction. In one embodiment, the linear stage may be operatively coupled to a resin unit and a wire disposing device. The resin unit may be configured to dispose a desirable amount of resin on at least a portion of the wire to provide a resin-embedded coil. The wire disposing device may be configured to guide a portion of the wire being disposed on a surface of the support. The wire may have a circular or non-circular cross-section.

In certain embodiments, the controller unit may be configured to assess in real-time or near real-time the progress of winding. In some embodiments, the automated coil winding system may include a spindle that is configured to rotate the coil form. The coil form is configured to receive at least a portion of the wire being fed from the supply source. In one embodiment, the supply source may be a supply spool.

In certain embodiments where the wire of the coil has a relatively smaller diameter, the turn-count per layer may be relatively difficult to control. Further, in the case of resin-embedded coils, the presence of resin reduces the frictional force between the wire and the support surface. The reduced frictional force between the wire turns or between the wire and the support surface is usually accommodated by increasing the tension on the wire. However, the ultimate tension that may be applied to the wire during winding of the wire is limited by the yield strength of the wire. The presence of resin also provides a hydraulic force that acts to increase the separation between adjacent loops of the wire.

In operation, the coils may be disposed precisely onto a rotating support surface (e.g., a mold-bobbin). In one embodiment, to ensure uniform resin distribution in the coil, a portion of the wire may be coated with the resin immediately prior to the placement of the portion of the wire on the support surface. Precise placement of the wire in the first layer of the coil-pack is especially important to ensure correct placement of the wire in subsequent layers due to nesting of the round wire.

It should be noted that the resin used to coat the wire has a liquid open time measured in the range of minutes to hours, which constrains the time available for winding. As used herein, the term "liquid open time" refers to a portion of a cure time of the resin, during which the resin or epoxy is still in a liquid state, and where the resin or epoxy is workable and suitable for application without affecting the eventual bond.

In certain embodiments, it is desirable to determine whether the wire is disposed in the desirable position on the support surface or on a previous layer in the coil winding and to correct any errors in the coil winding before the resin solidifies. Furthermore, it is desirable to know the quality of the wind and detect any defects in real-time during the winding, to enable operators to determine one more actions including: 1) accept the defect and continue with the winding, 2) stop and rework the winding to correct the defect, or 3) abort the winding to minimize wastage of the wire.

It should be noted that the systems of the present disclosure are configured for producing precision magnetic coil windings using dry winding methods as well as wet winding methods. Accordingly, in embodiments configured for the dry winding methods, the systems may not employ a resin unit. Whereas, in embodiments configured for the wet winding methods, the systems may employ the resin unit to provide resin or epoxy to be disposed on at least a portion of the wire.

Turning to FIG. 1, the medical imaging system 10 may include a magnetic resonance imaging (MRI) system. The MRI system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner including a patient bore 18 into which a table 20 may be positioned to place the patient 22 in a desired position for scanning. The scanner 12 may be of any suitable type of rating, including scanners varying from a 0.5 Tesla rating to a 1.5 Tesla rating and beyond.

Additionally, the scanner 12 may include a series of associated coils for producing controlled magnetic fields, for generating radio-frequency (RF) excitation pulses, and for detecting emissions from gyromagnetic material within the patient 22 in response to such pulses. In the diagrammatical view of FIG. 1, a primary magnet coil 24 may be provided for generating a primary magnetic field generally aligned with a patient bore 18. It is desirable to have a homogeneous primary magnetic field. The presence of winding defects, such as gaps between adjacent turns, overlap of the wire, criss-crossing of the wire, and other defects in the magnetic coil winding affects the homogeneity of the magnetic field in an undesirable fashion. Accordingly, it is desirable to employ the coil 24 with minimum or zero defects.

In certain embodiments, systems and methods provide precision magnetic coil windings having minimal defects. Also, the systems and methods enable production of the coils in a time efficient manner. In the illustrated embodiment, a series of gradient coils 26, 28 and 30 may be grouped in a coil assembly for generating controlled magnetic gradient fields during examination sequences as will be described in greater detail hereinafter. An RF coil 32 may be provided for generating radio frequency pulses for exciting the gyromagnetic material. In some embodiments, the coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from the RF coil 32. Such coils may include structures specifically adapted for target anatomies, such as head coil assemblies, and so forth. Moreover, receiving coils may be provided in any suitable physical configuration, including phased array coils, and so forth.

In a presently contemplated configuration, the gradient coils 26, 28 and 30 may have different physical configurations adapted to their function in the imaging system 10. As will be appreciated by those skilled in the art, the coils include conductive wires, bars or plates that are wound or cut to form a coil structure that generates a gradient field upon application of control pulses as described below. The placement of the coils within the gradient coil assembly may be done in several different orders. In one embodiment, a Z-axis coil may be positioned at an innermost location, and may be formed generally as a solenoid-like structure that has relatively small impact on the RF magnetic field. Thus, in the illustrated embodiment, gradient coil 30 is the Z-axis solenoid coil, while coils 26 and 28 are Y-axis and X-axis coils respectively.

The coils of the scanner 12 may be controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28 and 30 may be configured to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions may be applied along the X-axis, Y-axis and Z-axis of the original coordinate system or along other axes determined by combinations of pulsed currents applied to the individual field coils.

The slice select gradient determines a slab of tissue or anatomy to be imaged in the patient. The slice select gradient field may be applied simultaneously with a frequency selective RF pulse to excite a known volume of spins within a desired slice that precess at the same frequency. The slice thickness is determined by the bandwidth of the RF pulse and the gradient strength across the field of view.

The frequency encoding gradient is also known as the readout gradient, and is usually applied in a direction perpendicular to the slice select gradient. In general, the frequency encoding gradient is applied before and during the formation of the magnetic resonance (MR) echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

The coils of the scanner 12 are controlled by scanner control circuitry 14 to generate the desired magnetic field and RF pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Also, the control circuit 36 may further include memory circuitry 38, such as volatile and non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 is managed by amplification and control circuitry 40 and by transmission and receive interface circuitry 42. The amplification and control circuitry 40 includes amplifiers for each gradient field coil to supply drive current to the field coils in response to control signals from the control circuit 36. Transmit/receive (T/R) circuitry 42 includes additional amplification circuitry for driving the RF coil 32. Moreover, where the RF coil 32 serves both to emit the RF excitation pulses and to receive MR signals, the T/R circuitry 42 may typically include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 may include interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations thereof.

The system control circuitry 16 may include a wide range of devices for facilitating interface between an operator or radiologist and the scanner 12 via the scanner control circuitry 14. In the illustrated embodiment, for example, an operator controller 46 is provided in the form of a computer workstation employing a general purpose or application-specific computer. The workstation also typically includes memory circuitry for storing examination pulse sequence descriptions, examination protocols, user and patient data, image data, both raw and processed, and so forth. The workstation may further include various interface and peripheral drivers for receiving and exchanging data with local and remote devices. In the illustrated embodiment, such devices include a conventional computer keyboard 50 and an alternative input device such as a mouse 52. A printer 54 may be provided for generating hard copy output of documents and images reconstructed from the acquired data. Moreover, a computer monitor 48 may be provided for facilitating operator interface. In addition, the system 10 may include various local and remote image access and examination control devices, represented generally by reference numeral 56 in FIG. 1. Such devices may include picture archiving and communication systems, teleradiology systems, and the like.

Figure 2:
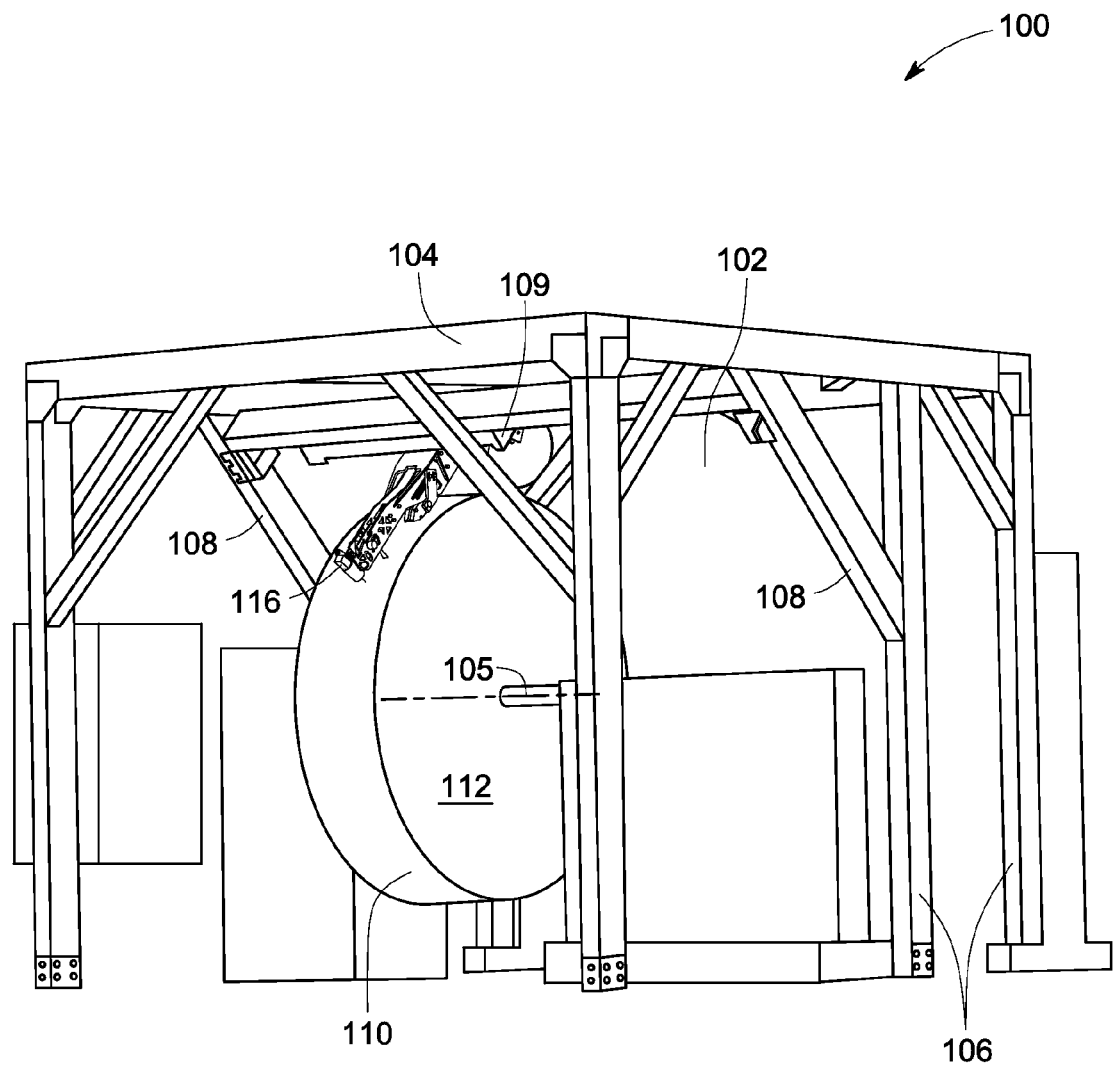
FIG. 2 is a perspective view of an example wire disposing assembly, in accordance with aspects of the present disclosure.

FIG. 2 illustrates portions of a wire disposing assembly 100. The assembly 100 includes a gantry or a frame 102 for disposing various components that form the assembly 100. The frame 102 is formed of a support structure 104. The support structure 104 may include a plurality of legs. In the illustrated example embodiment, the support structure 104 includes a frame with six legs 106 spanning a center axis 105 of a spindle or a bobbin winder. In some embodiments, the support structure 104 may be coupled (e.g., bolted) to the floor and a portion of the winding machine to increase overall system rigidity and maintain alignment of a traverser and a linear stage 109 and the spindle.

In the illustrated embodiment, the support structure 104 may include a radial positioning device 108. In one example, the radial positioning device 108 may be configured to act as an adjustment axis. The support provided by the radial positioning device 108 may be at an angle of about 45 degrees to a vertical direction (Y-direction) of the support structure 104. The radial positioning device 108 may be configured to maintain a consistent distance from an end of a support arm 116 to a surface 110 of the bobbin 112.

The radial positioning device 108 may include an axial support beam, which provides a rigid support for the linear stage 109 while allowing for an adjustment in a position of the linear stage 109 along the winding axis (x direction). The axial support beam also maintains a parallel relationship between the linear stage 109 and the winding axis.

In some embodiments, the linear stage 109 may be controlled by the closed-loop feedback control system. In one embodiment, the precision linear stage 109 may be a substantially high-accuracy linear drive that is coupled to the wire disposing assembly.

In certain embodiments employing an open loop feedback control system, movement of the support arm proceeds directly from a theoretically desired motion prescribed by a reference trajectory. In certain other embodiments employing a closed-loop feedback control system, the position of the wire disposing device is determined based on feedback comparing actual and desired wire positions, i.e., the instantaneous current position of the wire (as measured by a wire profile sensor) and the current point in the reference trajectory.

Figures 3A, 3B:
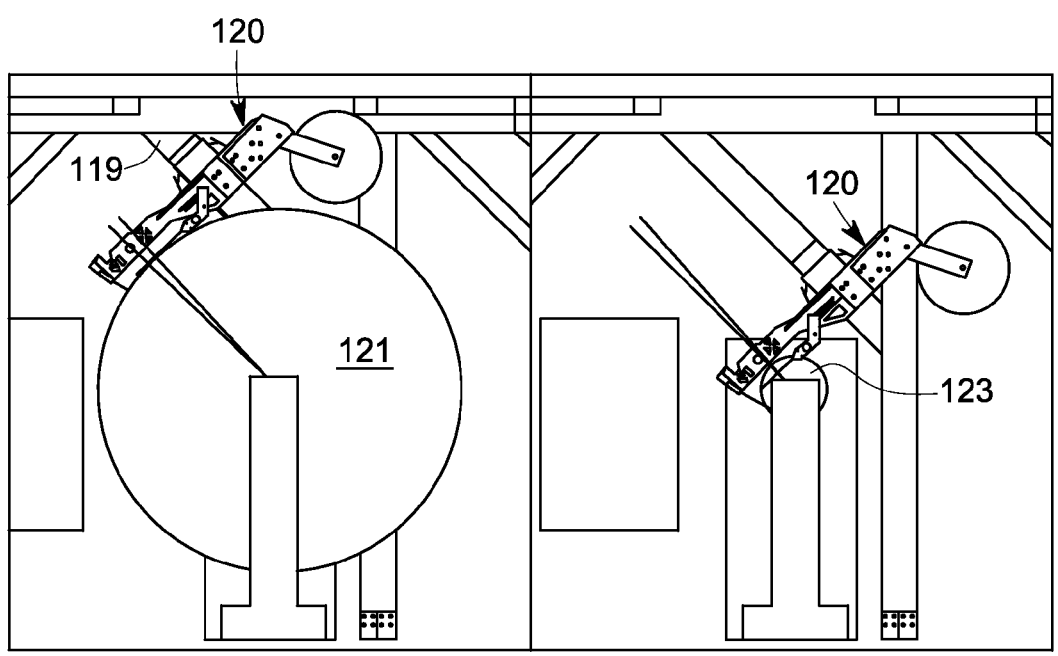
FIGS. 3a-3b are side views of example radial positioning devices configured to maintain consistent alignment of a support arm for different bobbin diameters, in accordance with aspects of the present disclosure.

As shown in FIGS. 3a and 3b, the assembly uses a support arm 120 and a radial positioning device 108 (see FIG. 2). The radial positioning device 108 is configured to accommodate bobbins 121 and 123 having different diameters. Advantageously, the radial positioning device 108 is configured to accommodate bobbins 121 and 123 with minimal or no adjustments to the support arm 120 required, thereby minimizing the set-up time for the wire disposing assembly.

Figure 4:
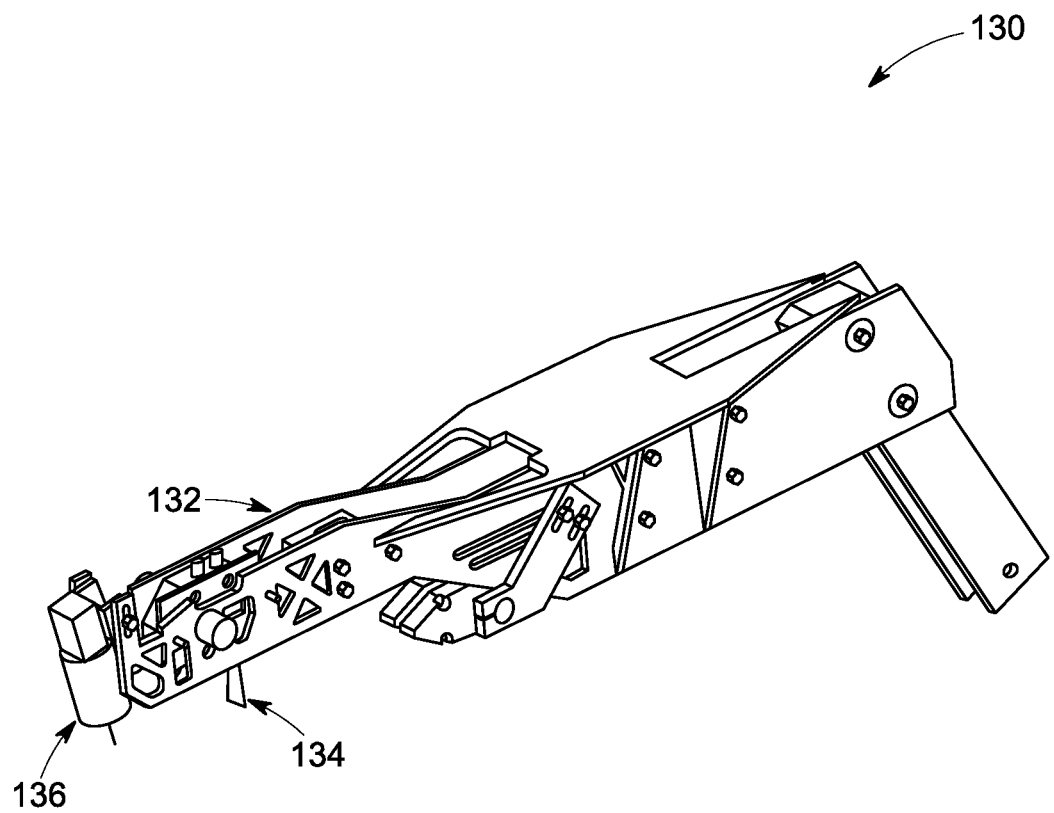
FIG. 4 is a perspective view of an example support arm, in accordance with aspects of the present disclosure.

FIG. 4 illustrates an example support arm 130 that includes a dispenser support structure 132 and a profilometer 134. In some embodiments, the support arm 130 includes a wire position sensor. Also, in one embodiment, the wire position sensor may be a profilometer 134. The profilometer 134 is configured to provide data representative of a profile of the wire disposed on the support. The dispenser support structure 132 is used to dispose the wire on the surface of the bobbin. In a non-limiting example, the profilometer 134 may be a laser profilometer. The support arm 130 may further include a camera 136, a wire disposing device (not shown) and an epoxy dispensing cartridge (wet head) (not shown). In one example, an epoxy coated wire may be passed through a guiding wheel before being disposed on the bobbin (not shown). In some embodiments, the support arm 130 may be configured to maintain a linear alignment for wire-handling components, such as, but not limited to, the guiding wheel and epoxy dispensing cartridge. Additionally, the support arm 130 may be configured to hold the profilometer 134 such that a field of view of the profilometer 134 may be directed to a centerline of the winding axis. Focusing the field of view of the profilometer 134 at the centerline of the winding axis facilitates consistency of the measured profile during dispensing, regardless of the bobbin diameter. Advantageously, maintaining the consistency of the measured profile during dispensing, regardless of the bobbin diameter, enables a higher level of accuracy for feedback into the closed-loop control system. In some embodiments, the support arm 130 may be configured to provide flexibility for a variety of wire winding applications and to supply mounting positions for additional winding controls as required.

Figure 5:
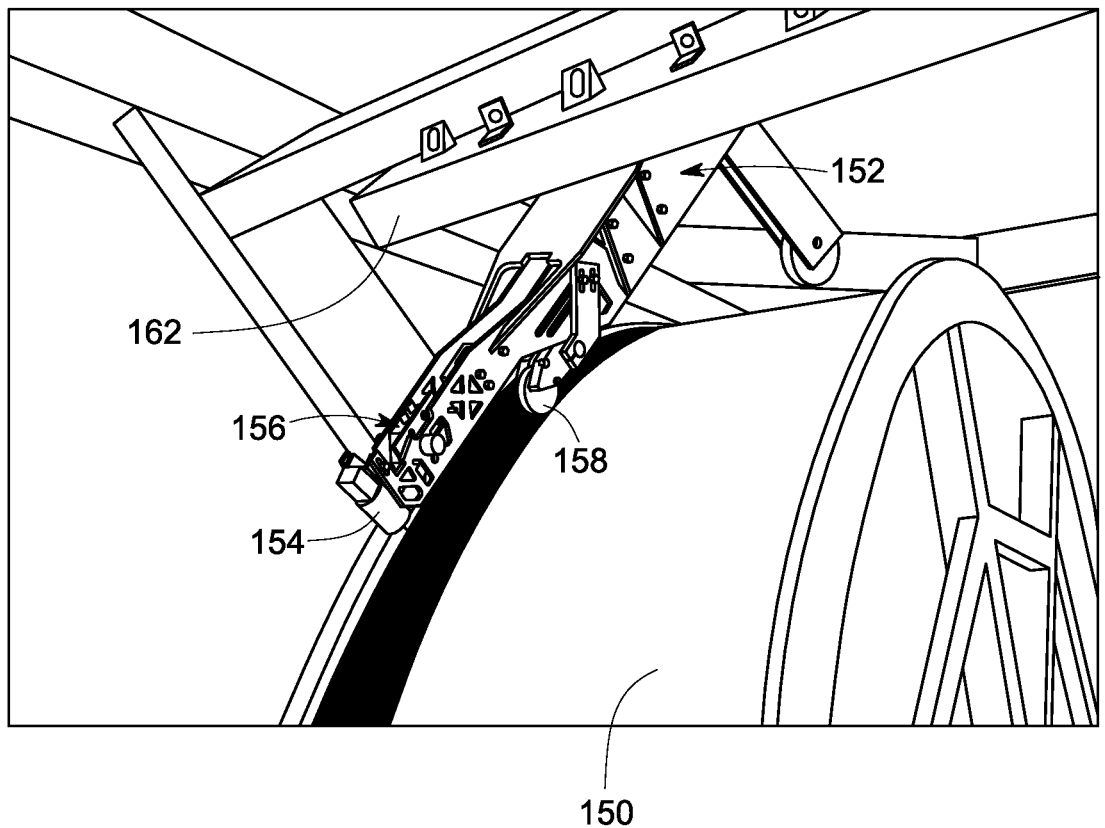
FIGS. 5-7 are perspective views of portions of an example wire disposing assembly configured for wet winding techniques, in accordance with aspects of the present disclosure.
Figure 6:
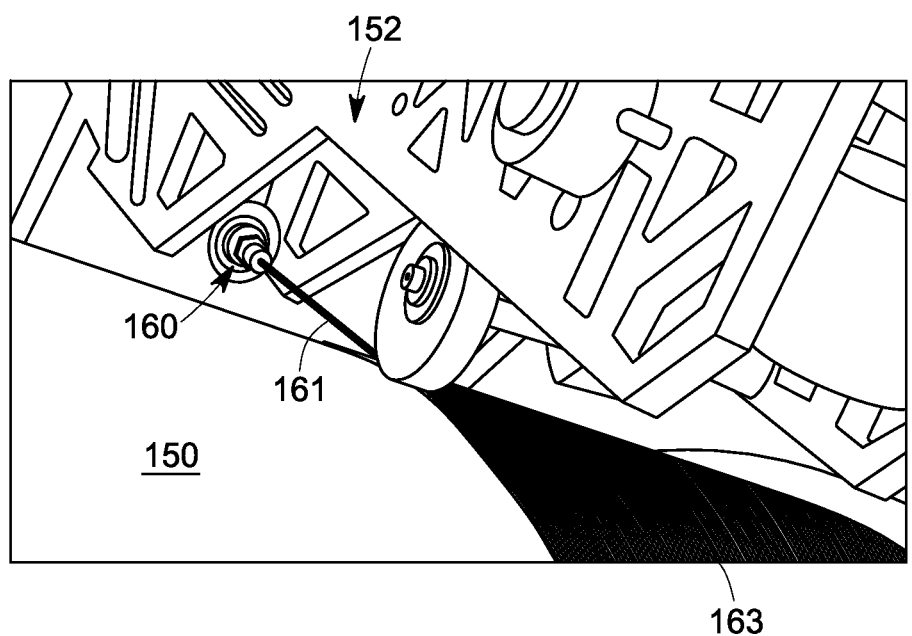
Figure 7:
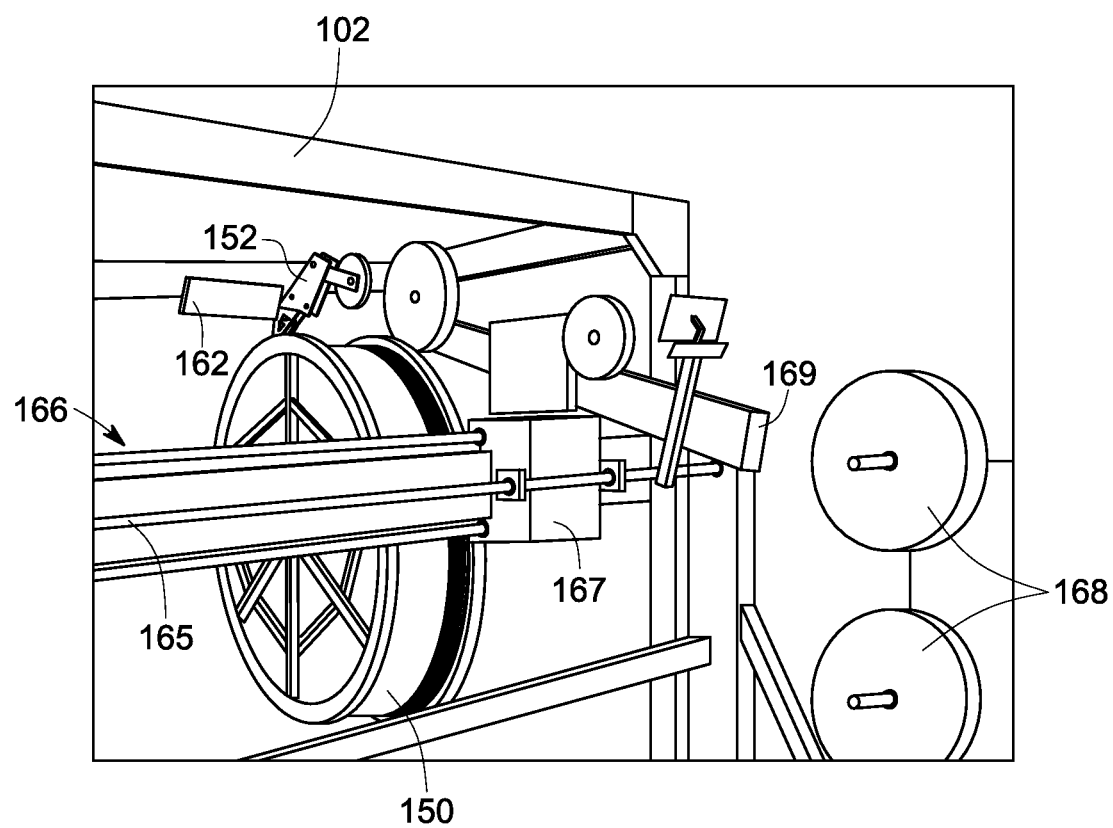

FIGS. 5-7 illustrate detailed views of portions of the assemblies of FIGS. 2-4. In the illustrated embodiment of FIG. 5, the assembly may include a coil form or bobbin 150. The bobbin 150 may be mounted on a spindle (not shown) that is configured to rotate the bobbin 150. The bobbin 150 may be configured to receive a wire that is to be fed to the bobbin 150 from a supply source (not shown), e.g., a supply spool. The bobbin 150 may receive the wire via a support arm 152. The support arm 152 may be coupled to a wire disposing device 158. The support arm 152 may include a linear stage 162. The wire disposing device 158 may be configured to dispose wire at desirable locations on the bobbin 150 in a controlled manner. The wire disposing device 158 may be disposed on the support arm 152 at a position above the bobbin 150 where a portion of the wire which is to be disposed on the bobbin 150 contacts the bobbin 150. Additionally, the support arm 152 may be coupled to a camera 154 and a profilometer or sensor 156 (e.g., laser sensor) for profiling the wire during winding of the coil. In one embodiment, the camera 154, sensor 156, and other sensors (not shown) may be configured to provide real-time measurements of the wound profile, wire feed rate, wire diameter, spindle rotation, or combinations thereof.

Typically, in wet winding techniques, the wire being disposed on a bobbin may drift slightly off position. For example, the presence of resin between turns of the wires, and waviness of the wire, may cause the wire to drift off position slightly. Usually, even under active servo control of the traverse axis, without a guiding wheel, such drifting may often cause cumulative error, thereby resulting in insufficient space to dispose the desirable number of turns in any layer. Feedback control of the linear stage 162 may provide a measure of correction to the cumulative error in the wire position. However, in many instances, the cumulative wire position error may not be corrected to a desirable extent, resulting in failure to accommodate the desired number of turns of the wire per layer of the coil winding. Advantageously, the wire disposing device prevents the wire being disposed on the bobbin from drifting off position.

In certain embodiments, when forming the MRI coils, it is desirable to maintain wire supply from the supply source to the wire disposing device at a constant tension as a change in the tension may result in irregularities in the winding coil. In some embodiments, passive or active tension control devices may be used to control the tension at a desirable value. Furthermore, in one embodiment, the tension in the wire supply may be controlled by regulating the speed of rotation of the spindle. In this embodiment, the speed of rotation of the spindle, and in turn the support or bobbin, may be controlled by a drive unit. In some embodiments, the drive unit may include encoders to monitor a shaft speed of a shaft of the spindle. A value of a desirable shaft speed may be provided by a computer or an operator. In one embodiment, the shaft speed is controlled by an operator actuating a mechanical pedal that is operatively coupled to the shaft. In another embodiment, the control of the shaft speed may be automated. The value of the desirable shaft speed may be provided by using a look up table that specifies the speed at all positions of the spindle starting from the beginning of the winding process and continuing to the end. Whether the control of the shaft speed is manual or automated, at any given instant in time, a measurement of a spindle angle is obtained, and the reference trajectory is interpolated to arrive at the corresponding desired axial and radial positions of the wire.

As noted hereinabove, in certain embodiments, it is desirable to provide efficient cryogenic cooling of the coil during operation of the MRI scanner. In some embodiments, the wire forming the coil may be impregnated with an epoxy resin to facilitate cryogenic cooling.

As illustrated in FIG. 6, in some embodiments, the support arm 152 may include a resin unit 160. In these embodiments, en route from a supply source (not shown) to the wound coil on the surface of the bobbin 150, the wire may pass through the resin unit 160. The resin unit 160 is configured to dispose resin on at least a portion of the wire 161 being disposed on the surface of the bobbin 150. Reference numeral 163 represents the portion of the wire that is already disposed on the surface of the bobbin 150. In one embodiment, the resin unit 160 is configured to dispose pre-mixed epoxy resin on the wire at a desirable volumetric rate. Furthermore, in one embodiment, the dispense rate of the resin dispensed by the resin unit 160 on the wire may be matched to the feed rate of the wire fed by the supply source. In one example, the feed rate of the wire may be determined using an idler wheel employing a form of shaft encoding.

In certain embodiments, the resin unit 160 may include a cartridge container, a dispensing device, a resin cartridge, and a centering device. Advantageously, the resin unit 160 facilitates disposing a desirable amount of resin on to the wire before the wire is wound onto the bobbin 150.

Referring now to FIG. 7, the support arm 152 may include a linear stage 162 that is configured to provide accuracy to the wire disposing step. It should be noted that for winding purposes, both gross and fine wire motion may be realized using a high-precision linear stage. The linear stage 162 may be coupled to the frame 102 (see FIG. 2). The linear stage 162 may be configured to move the support arm 152. In one embodiment, the linear stage 162 employs high resolution position feedback to achieve geometries of desirable shapes in the coil winding. In one example, the shaped geometries may include non-helical winding geometries.

As illustrated in FIG. 7, in addition to the linear stage 162, the assembly may include an axial traverser sub-assembly 166, whose rate of motion is coupled to a speed of rotation of the spindle or support. For example, the rate of motion of the axial traverser sub-assembly 166 is linearly coupled to the speed of rotation of the spindle. In certain embodiments, the axial traverser sub-assembly 166 may include a beam 165, a motor and gear box 167, a tension control device 168, and an arm 169. The motor and gear box 167 may be used to motorize the motion of the axial traverser sub-assembly 166. In one embodiment, the arm 169 may be coupled to the tension control device 168. In embodiments where the axial traverser sub-assembly 166 and the linear stage 162 are mechanically coupled, the arm 169 is used to couple the axial traverser sub-assembly 166 to the linear stage 162. The axial traverser sub-assembly 166 may be configured to move the support arm 152, the supply source (not shown) and the tension control device 168. The tension control device 168 is configured to maintain a desired tension in a portion of the wire traversing between the supply source and the bobbin 150. The axial traverser sub-assembly 166 may be configured to provide gross motion to the various components of the assembly. For example, the axial traverser sub-assembly 166 may be configured to provide gross motion to the support arm 152 and the supply source.

In certain embodiments, the axial traverser sub-assembly 166 and the linear stage 162 are mechanically decoupled from one another. In these embodiments, the axial traverser sub-assembly 166 provides coarse placement of the wire from the supply source to minimize transverse tension in the wire, while the linear stage 162 provides precision placement of the wire close to the surface of the bobbin 150. Advantageously, decoupling of the two positioners, namely the axial traverser sub-assembly 166 and the linear stage 162 prevents vibrations of the relatively high mass supply source from affecting the final wire position on the bobbin 150.

Figure 8:
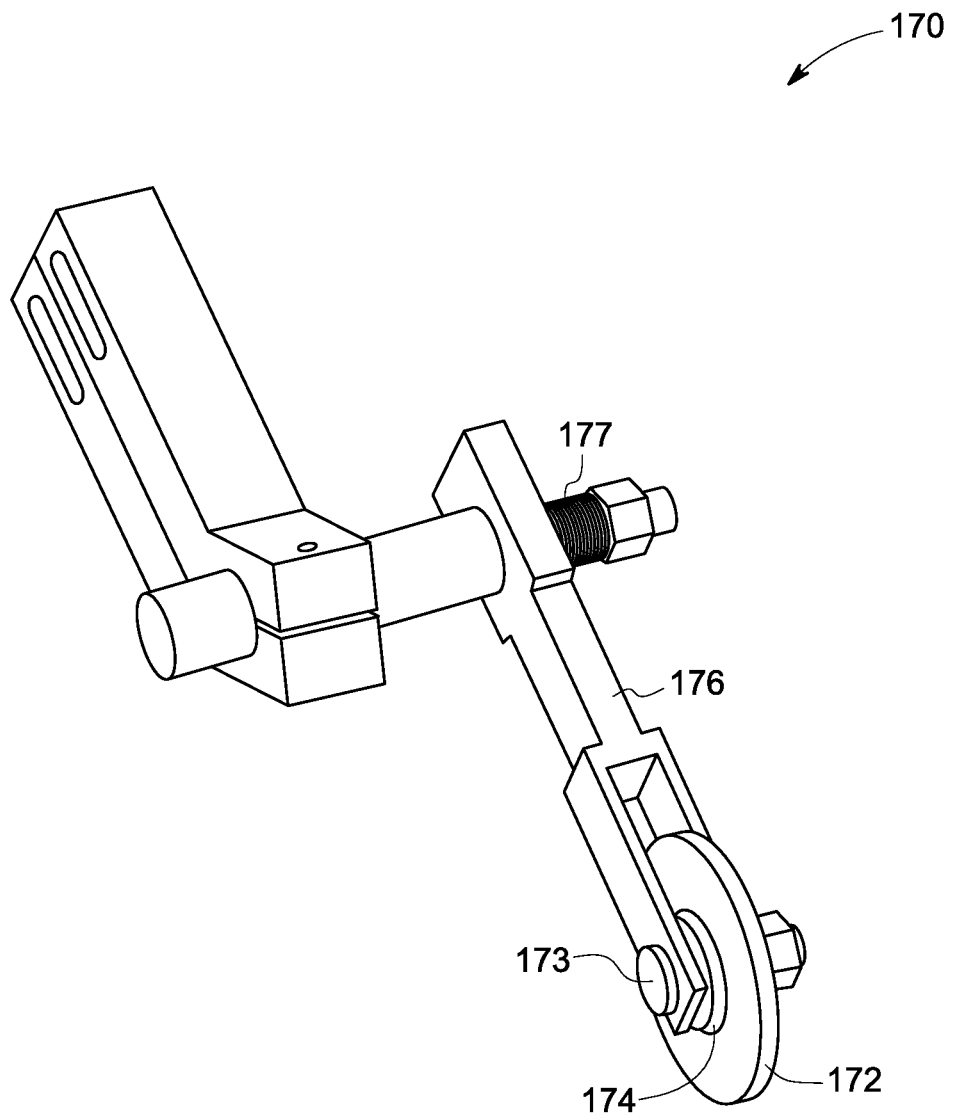
FIGS. 8-9 are perspective views of alternative arrangements of wire disposing assemblies, in accordance with aspects of the present disclosure.
Figure 9:
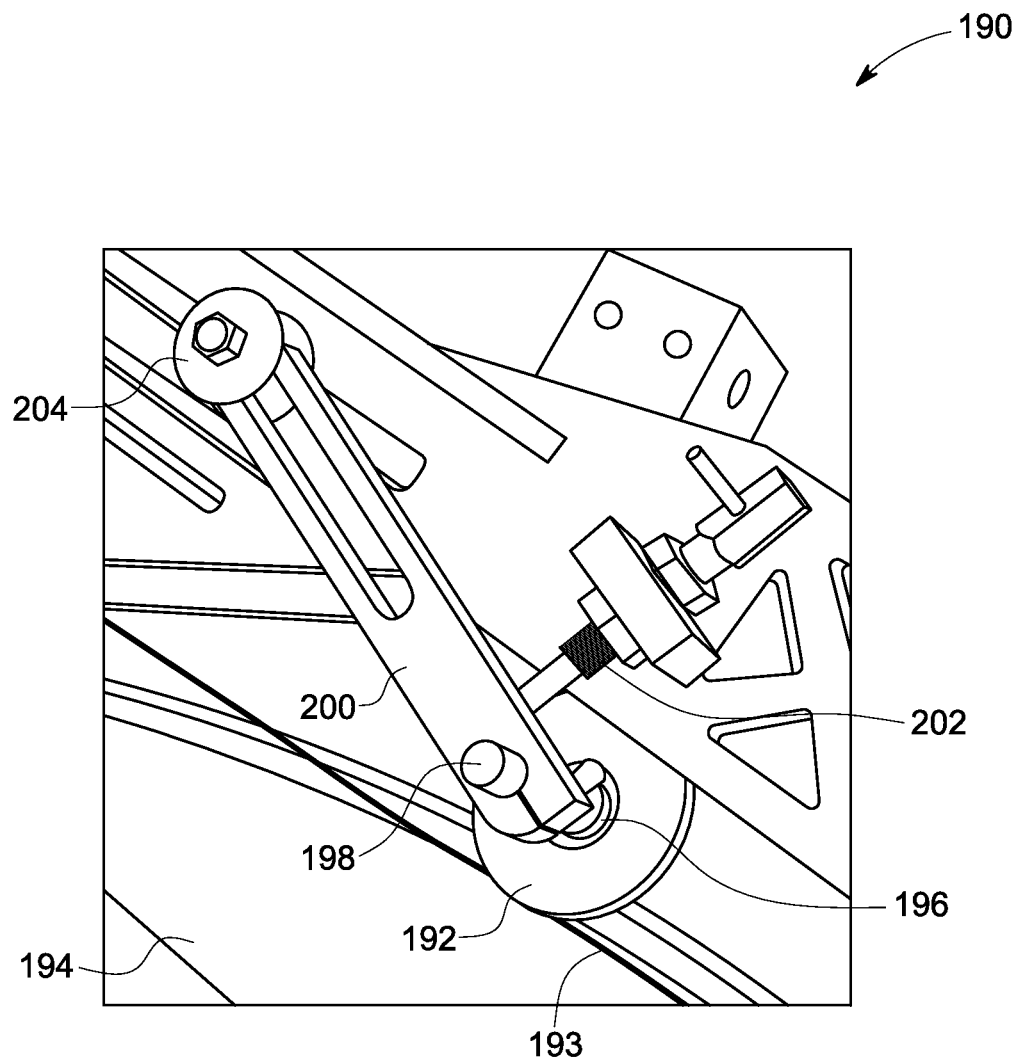

FIGS. 8-9 illustrate alternative embodiments of a portion of a support arm 170 having a wire disposing device. FIG. 8 illustrates an example of a support arm. The support arm 170 may be configured to position the wire in a desirable axial position on a surface of the bobbin. In the illustrated embodiment, the support arm 170 may include a guiding wheel 172 as a wire disposing device. Other non-limiting examples of the wire disposing device may include any mechanical structure that includes a space for the wire to be guided through the device. Non-limiting examples of the wire disposing device may also include a hollow tube, a slot, a channel, a hole, a slit, an aperture, or combinations thereof. In certain embodiments, in case of positional errors, such as, but not limited to, gaps, ride-ups, drop-ins, and other anomalies in disposing the wire, the guiding wheel 172 may be further configured to provide correction to the wire position. The support arm 170 may further include a wheel bearing 174 that is configured to rotate freely with minimal friction, thereby allowing the guiding wheel 172 to rotate freely. The support arm 170 may also include an adjustable pivoting sub-arm 176, where the sub-arm 176 is configured to mount a wheel shaft 173. In the illustrated embodiment, the support arm 170 may include a spring load 177 configured to adjustably apply a force on the pivoting sub-arm 176 to keep the guiding wheel 172 in contact with the bobbin and/or the coil. The arm 170 may further include a pivoting bearing and mount for mounting the pivoting sub-arm 176 to the traverser of the winding machine.

FIG. 9 illustrates an alternate embodiment of the support arm 170 of FIG. 8. In the illustrated embodiment, the support arm 190 may include a guiding wheel 192 configured to guide a wire 193 while disposing the wire 193 on a bobbin 194. The guiding wheel 192 may be configured to provide corrections in the wire positioning immediately after disposing the wire 193 on the bobbin 194. The support arm 190 may further include a wheel bearing 196 configured to rotate the guiding wheel 192 with minimal friction, and an adjustable wheel shaft 198 configured to mount the guiding wheel 192 and the wheel bearing 196. Further, the wheel shaft 198 may also be configured to provide a means to adjust the traverse position of the guiding wheel 192 on the bobbin 194.

The wire disposing device, such as, but not limited to, the guiding wheel 192, may be made of a soft material, such as, but not limited to, polytetrafluoroethylene (PDFE) that may require replacement. Alternatively, the wire disposing device may be made of a hard material such as, but not limited to, stainless steel for enhanced durability. The diameter of the guiding wheel 192 may be adjusted to ensure that the wheel shaft 198 clears flanges of the bobbin 194. The height of the flanges of the bobbin 194 is a function of the total number of layers of the coil. In one embodiment, the thickness of the guiding wheel 192 is one or two times larger than the winding pitch, to prevent the guiding wheel 192 from dropping between the wires during winding.

The support arm 190 may further include an adjustable pivoting arm 200. The support arm 190 is configured to mount the wheel shaft 198. The pivoting arm 200 may also be configured to pivot the guiding wheel 192 and the wheel shaft 198 up and down relative to the bobbin surface. The support arm 190 may further include a spring load 202 to apply an adjustable force on the pivoting arm 200 to maintain physical contact between the guiding wheel 192 and the bobbin 194 and/or the coil. Additionally, the support arm 190 may include a pivoting bearing and mount 204 for mounting the pivoting arm 200 to the traverser of the winding machine.

In certain embodiments, where the linear stage and the axial traverser sub-assembly are mechanically coupled, the linear stage is mounted on the axial traverser sub-assembly. In certain other embodiments, where the linear stage and the axial traverser sub-assembly are mechanically decoupled, the linear stage is mounted on the frame (see FIG. 2).

Furthermore, in some embodiments, the systems may employ a high precision linear stage to axially position the incoming wire in accordance with a rotation of the spindle. In certain embodiments, an axial position of the wire may be controlled at a point of tangency of the wire to the rotating spindle. In an example embodiment, the axial position of the wire may be controlled using the linear stage. In this example embodiment, the wire disposing device may be coupled to the linear stage. The wire disposing device may be aligned parallel to the axis of rotation of the spindle. In certain embodiments, the linear stage may be a precision linear stage that may be configured to employ substantially high accuracy position feedback.

Also, in certain embodiments, the linear stage may employ a low-precision but high load bearing main traverser. In some of these embodiments, a rate of axial motion of the linear stage may be related to a rotational speed of the bobbin or the spindle. In these embodiments, the main traverser may be configured to carry the supply source and tensioning device. In one embodiment, a sub-linear positioner may be operatively coupled to the main traverser such that the sub-linear positioner may encounter the rotating spindle during coil winding. The sub-linear positioner may be configured to at least partly account for (correct) mechanical instability and/or inaccuracy of the main traverser and positions of the guiding wheel with a desirable accuracy using an active feedback control. In an alternative embodiment, a relatively larger scale, physically decoupled linear positioner may be configured to provide at least in part a positioning of the guiding wheel. In this embodiment, the main traverser may be configured to simply handle carriage of the wire spool and a tensioner.

Figure 10:
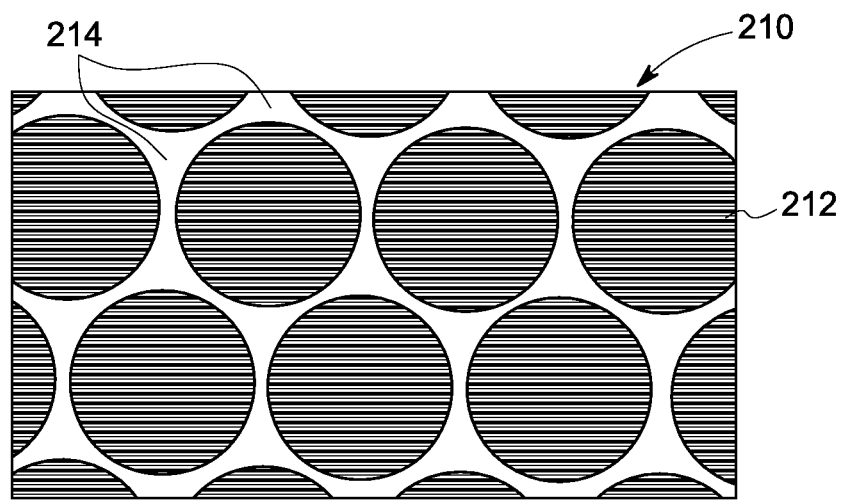
FIG. 10 is an enlarged cross-sectional view of a portion of a precision magnetic coil winding formed using wet winding techniques, in accordance with aspects of the present disclosure.

In some embodiments, methods for making the precision magnetic coil winding may include disposing a resin material on at least a portion of the wire of the coil. In one embodiment, the resin material may include an epoxy based resin. Moreover, in another embodiment, the resin material may include non-epoxy based resin. In some embodiments, the resin may include epoxy with or without fillers. By way of example, in one embodiment, the fillers may be solid fillers. In wet winding coils for MRI machines, it is desirable to wind a determined number of turns per layer and dispose a corresponding amount of resin to at least partially encapsulate the wound wire. FIG. 10 illustrates a cross sectional view of a portion of a coil winding formed using wet winding techniques of the present disclosure. Subsequent to winding, the coil 210 is cured for a determined period of time to cure resin material 214 disposed on the wire. In the illustrated embodiment of FIG. 10, a cross section of the cured and wound coil 210 includes nested wires 212 encapsulated in the resin 214.

Figure 11:
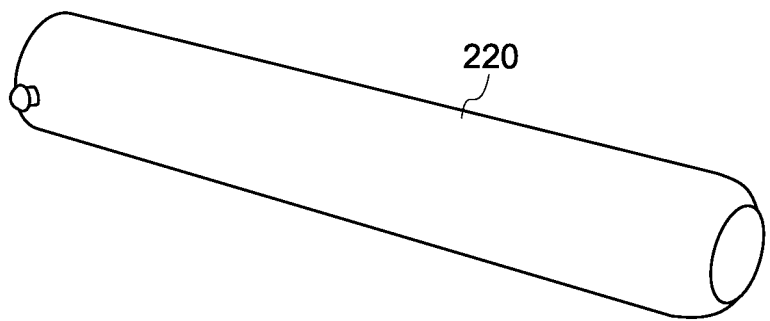
FIG. 11 is a cross-sectional view of an example container configured to house a cartridge for providing resin, in accordance with aspects of the present disclosure.

FIG. 11 illustrates a cartridge holder or container 220 for housing the resin material prior to disposing the resin material on the wire. In one example, the resin material may be in the form of a cartridge. In this embodiment, the container 220 may be configured to hold the cartridge. In some embodiments, the container 220 may be configured to have a replaceable cartridge. In some of these embodiments, a used cartridge may be replaced with a new cartridge. In the illustrated embodiment, the container may include a sleeve (not shown). The sleeve may be configured to hold the cartridge. The sleeve may include pivot points at one end for mounting the resin unit to the assembly such that the container may be aligned with the wire direction by pivoting.

Figure 12:
FIG. 12 is a cross-sectional view of an example cartridge for providing resin, in accordance with aspects of the present disclosure.

FIG. 12 illustrates an example cartridge 216 used in a resin unit of the present application. The cartridge 216 may be designed as a chamber to hold epoxy and for the wire to go through. Also, the cartridge 216 may include a resin that is to be disposed on the wire during coil winding. In the illustrated embodiment, the cartridge 216 may have a first opening 217 and a second opening 218. The first opening 217 may be configured to allow the wire to enter the cartridge 216. In the illustrated embodiment, the second opening 218 is relatively smaller than the first opening 217. The first opening 217 may be wider than the second opening 218 to facilitate smooth entry of the wire in the cartridge 216. However, in some embodiments, the first opening 217 may be smaller, or similarly sized as the second opening 218. In some embodiments, the first opening 217 may be used for disposing the resin in the cartridge 216. For example, the first opening 217 may be used for refilling the container with a new cartridge after the current cartridge is depleted. The size and shape of the second opening 218 may be such that the at least partially coated wire may exit the cartridge and the wire disposing device may be mounted at the second opening. The cartridge 216 may be made of materials such as, but not limited to, a metal, a plastic, a ceramic, or combinations thereof. The size of the cartridge 216 as well as the amount of the epoxy to be replenished into the cartridge 216 during winding primarily depends on the allowable working time window of the epoxy before a viscosity of the resin significantly increases as a result of curing. Either a manual or an automatic replenishing system may be used to replenish the epoxy in the cartridge 216.

Figure 13:
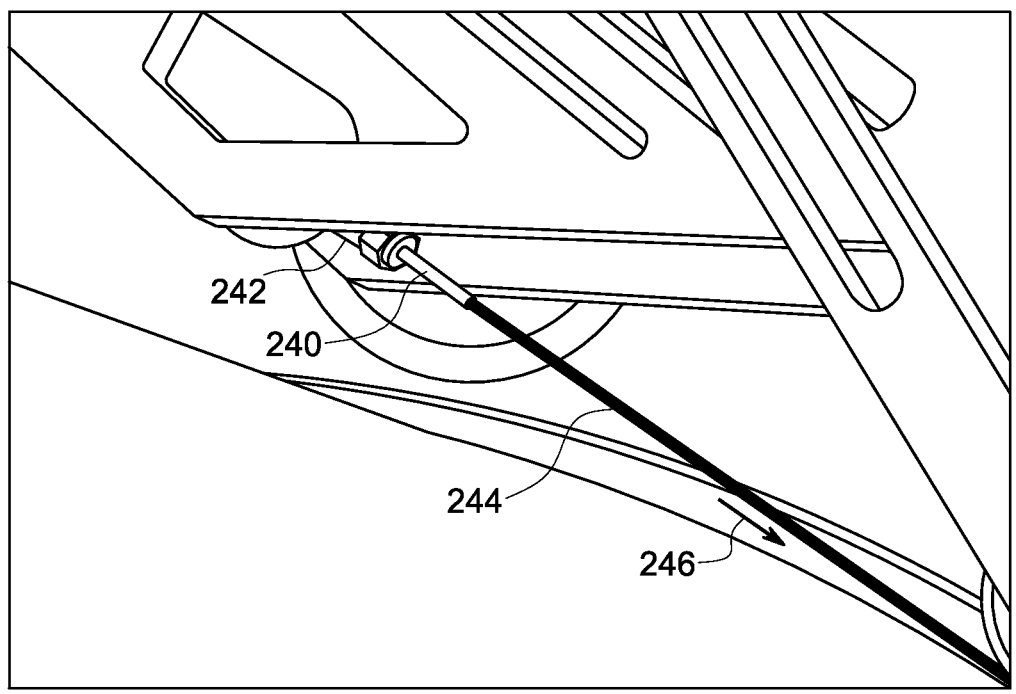
FIGS. 13-14 are perspective views of portions of an example resin unit configured to at least partially coat the wire with resin, in accordance with aspects of the present disclosure.

FIG. 13 illustrates a portion of a resin unit having a dispensing device 240. The dispensing device 240 may provide a passage for the coated wire to pass through. In the illustrated embodiment, the dispensing device 240 is a needle. However, other variations of the dispensing device 240 are also possible. For example, the dispensing device may be in the form of a slot, an arm, a hollow tube, a split wire coating die, or the like. The dispensing device 240 may be coupled to a cartridge (not shown) to provide resin on at least a portion 244 of the wire. The cartridge may be disposed in a cartridge holder 242. A dispensing device, such as the needle 240 may be configured to provide a passage for a wetted/coated wire 244 to pass through the cartridge holder 242. The needle 240 may be mounted at an exit end of the cartridge holder 242. Arrow 246 represents the direction of traversal of the wetted wire 244 prior to the wire 244 being disposed on the bobbin. The wire 244 travelling in the direction 246 from the needle 240 may reach the disposing device, where the disposing device may then dispose the wire on the bobbin. The size of the opening of the needle 240 is calculated according to the amount of resin that needs to be coated on the wire to provide sufficient resin to fill the gaps between wires when they are wound and nested.

The desired amount of resin is dispensed onto the wire when the resin first passes through a bath in the cartridge holder 242 and then through the opening of the needle 240. The coated or wetted wire is passed through the dispensing needle 240. The size of the opening of the needle 240 is larger than the size of the wire. Assuming both the wire and the needle opening are of a circular shape, the size of the opening $(d_n)$ in the needle may be calculated as illustrated in Eq. (1).

$$d_n = d * \sqrt{\frac{V_t}{V_w}} \qquad \text{Eq. (1)}$$

where d is the wire diameter, $V_t$ is the volume of the wound coil including wire and epoxy, and $V_w$ is the volume of the wire within $V_t$.

Given the size of the wire, $V_t$ depends on the spacing between the wires. While determining the size of the opening in the needle 240, it may be noted that the wires present in the inner layers of the coil winding are nested within adjacent layers, and the space around the wires is uniform. Further, it is noted that the wires present in the outer layers of the coil winding may require relatively more epoxy to fill the space which is usually compensated by manually applying additional epoxy while winding the outer layers. In some embodiments, a pressurized cartridge design may be used to control the amount of epoxy on the wire depending on the position of the layer in the coil winding. In one example, the pressurized cartridge may be used to increase the pressure on the epoxy dispensed to increase the flow for the outer layers, and vice versa. In this case, the wire inlet into the cartridge will be through a long tube with little clearance to prevent epoxy leaking through the wire entrance.

In certain embodiments, a length of the needle 240 is sufficient to allow the epoxy molecules to align and flow through with the wire against the viscoelastic memory of the epoxy molecules. This ensures that the proper amount of epoxy is consistently dispensed onto the wire with minimal swelling at exit.

Moreover, in some embodiments, the material of the needle 240 may be durable for the duration of winding of the coil. Non-limiting examples of suitable materials for the needle may include metals, metal alloys, ceramics, cermets, tungsten carbide, or combinations thereof. In some embodiments, if the duration of winding surpasses the life of a single needle, other durable materials such as diamond may be used. In one embodiment, a needle may be constructed as longitudinally split parts that are held together around the wire with a clamping holder to facilitate changing of needle, if needed. In one embodiment, the needle may be designed as an opening through a thick piece of a single component.

Figure 14:
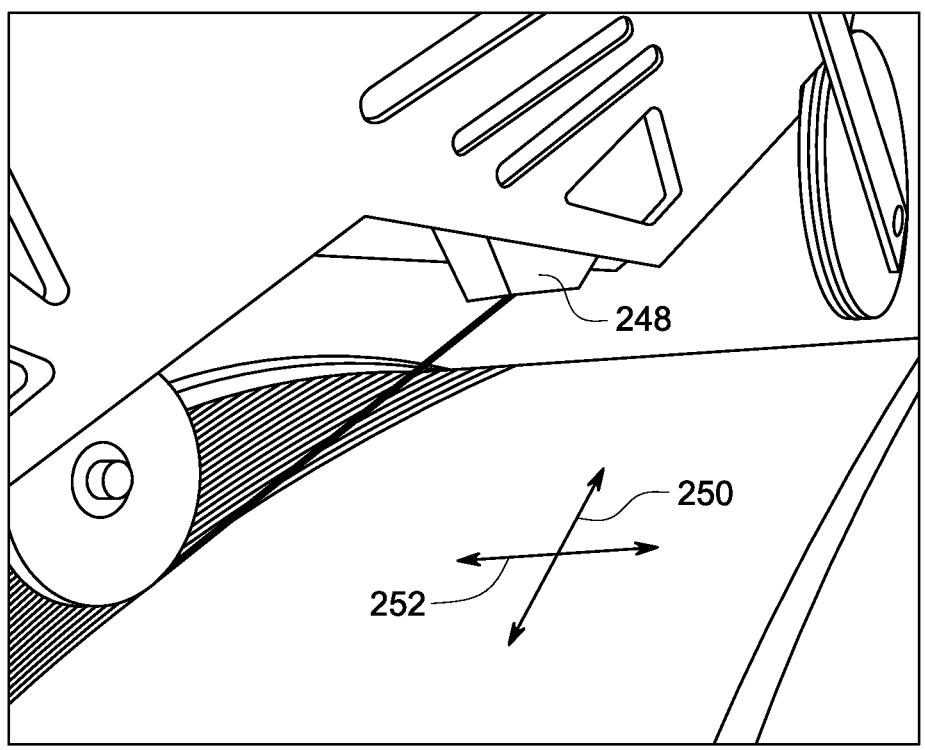

In certain embodiments, as the winding progresses, the position of the dispensing device 240 (see FIG. 13) may be adjusted to account for the axial and/or radial change in the position of the wire. In the illustrated example of FIG. 14, the resin unit may include a centering device 248 to adjust a position of the dispensing device 240. The centering device 248 may include an opening, such as a slot, where the opening is configured to receive the dispensing device (e.g., a needle). In one embodiment, the dispensing device 240 may have a sliding fit with the centering device 248 such that the dispensing device may be configured to slide in and out of the centering device 248. In the illustrated embodiment, the direction of movement of the dispensing device may be illustrated with reference numerals 250. In addition, the dispensing device 240 may be configured to move in directions towards or away from the surface of the bobbin. In one embodiment, the dispensing device 240 may have a fixed axial position, where the axial direction is represented by reference numeral 252.

As will be appreciated, for winding of MRI coils, it is desirable to dispose a determined number of turns into the available space between the flanges of a winding bobbin and ensure the correct nesting of wire between layers. Any substantial deviation of wire placement may result in insufficient room to dispose the desirable number of turns, or spare space between turns causing the next layer in the same location to drop in between the wire turns of the previous layer. In certain embodiments, a robust system and method may be provided to guide the wire to a desirable position. In addition, a feedback based method may be provided to supply amendments and corrections to ensure cumulative positional error is below a desirable threshold.

In the absence of the wire disposing device, the wire placed on the bobbin may drift off position due to reasons such as presence of resin between the wires, and waviness of the wire, which may in turn affect the positioning of the wire in subsequent turns. As noted hereinabove, even under active servo control of the traverse axis, without a wire disposing device (e.g., a guiding wheel) such drifting may result in cumulative error, thereby resulting in insufficient space to dispose the desired number of turns in a given layer.

Advantageously, with refinement on the winding process, relatively less time is required for adjusting the wire or correcting errors in disposing the wire. This further allows more consistent product performance via improved reproducibility in production, thereby resulting in reduced scrap rate, increased part quality, and increased production capacity, hence, allowing higher volume production of coils and overall reduced manufacturing costs.

Figure 15:
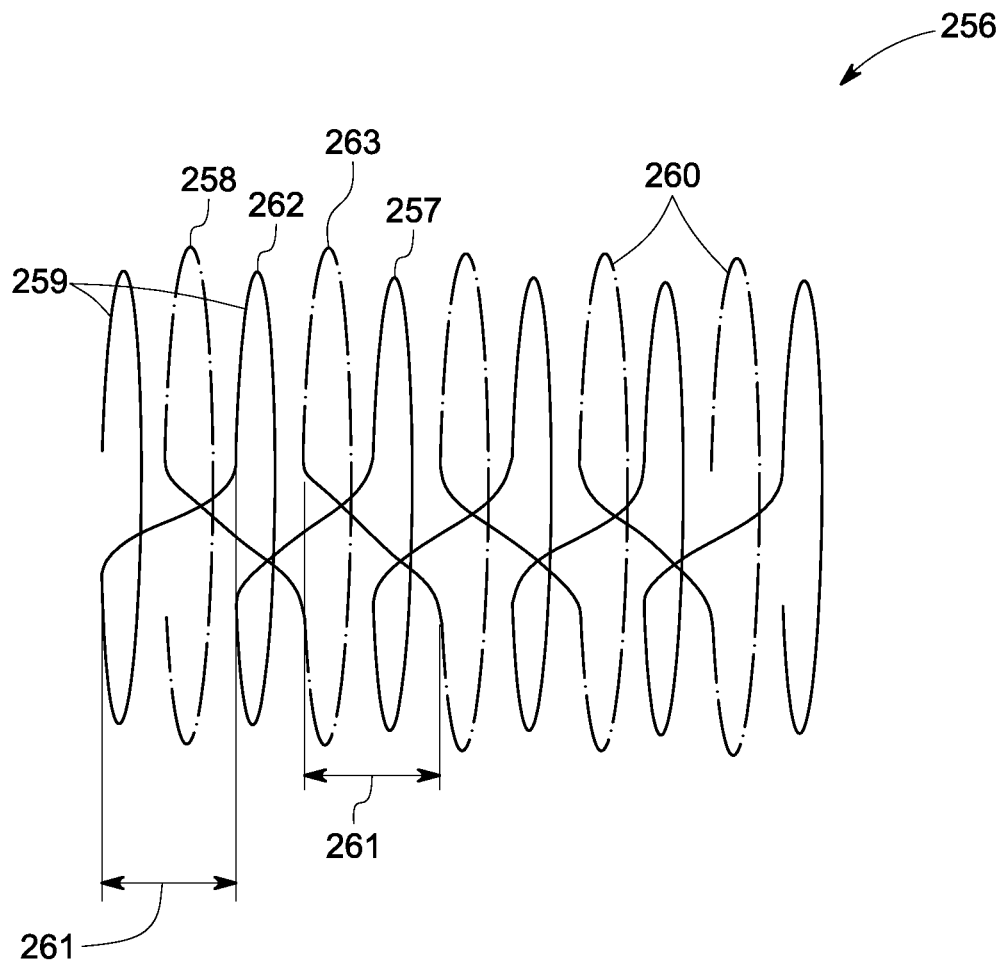
FIG. 15 is a graphical representation of an example winding geometry, in accordance with aspects of the present disclosure.

As illustrated in FIG. 15, in certain embodiments, a winding geometry may be non-helical in shape. In the illustrated embodiment, the winding geometry is generally represented by reference numeral 256. In the illustrated embodiment, two layers, a first layer 257 (represented by solid lines), and a second layer 258 (represented by dashed lines), of an example precision magnetic coil winding are illustrated. In one embodiment, each turn of the spindle may generate a loop or a turn lying in a plane that is parallel to a cross section of the bobbin. Each layer may include a plurality of loop-like coil shapes. In the illustrated embodiment, the first layer 257 includes loop-like coil shapes 259. Similarly, the second layer 258 includes loop-like coil shapes 260. As illustrated, the loop-like coil shapes 259 and 260 may include transition regions, generally represented by reference numeral 261. The transition regions 261 may be defined as regions where wires 262 of the loop-like coil shapes 259 of the first layer 257 or wire 263 of the loop-like coil shapes of the second layer 258 cross over from one axial position to the next. During crossover, the wire 263 advances axially by approximately one wire diameter. To maximize winding density and promote mechanical stability of subsequent layers, it is desired that the transition from one turn to another occur over as short a wire feed length as possible. This is because when an endplate or flange of the bobbin is reached, the wire crosses up to the next layer, and the turns from the new layer nest stably within the valleys formed by the underlying layer. It should be noted that any tendency of the wire towards instability is normally confined to the transition regions, hence the desire to minimize the size of these regions.

In certain embodiments, geometric models of the winding geometry may be used to generate reference trajectories for tracking. In addition to positional feedback on the position of the linear stage, sensors deployed through the system provide real-time measurement of the wound profile, wire feed rate, wire diameter, and spindle rotation.

Additionally, in certain embodiments, the winding geometry may be a function of the spindle position. More particularly, the winding geometry may be a function of the spindle angle or the corresponding real-valued turn count. The axial motion of the spindle implied by this geometry follows the profile presented in FIG. 16. In the illustrated example, the profile is for a given set of geometric specifications, including bobbin diameter, coil length, wire diameter, transition angle, and the like.

Figure 16:
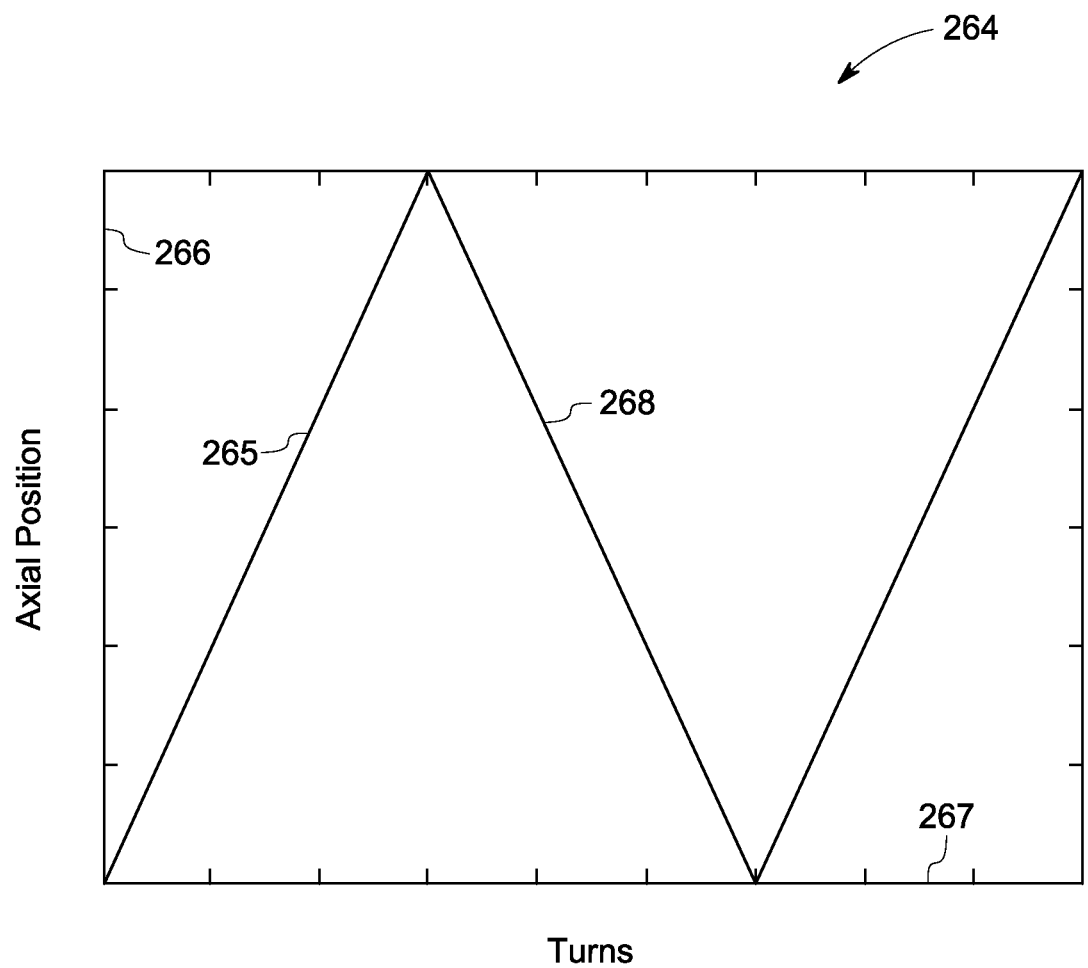
FIG. 16 is a graphical representation of a portion of a reference trajectory for a lead wire, in accordance with aspects of the present disclosure.

Referring to FIG. 16, in certain embodiments, as illustrated by a portion 265 of plot 264, the axial position (ordinate 266) of the wire increases linearly in a determined direction with each turn of the wire until a desired number of turns (abscissa 267) for a layer (or the coil form endplate) is reached. Subsequently, the motion of the wire in the axial direction is reversed, as represented by the portion 268 of the plot 264. The wire is wound in the reverse axial direction at the same rate to maintain a constant tension in the wire. It should be noted that portions 265 and 268 represent two layers of the precision coil winding, where the layers are disposed adjacent each other.

Figure 17:
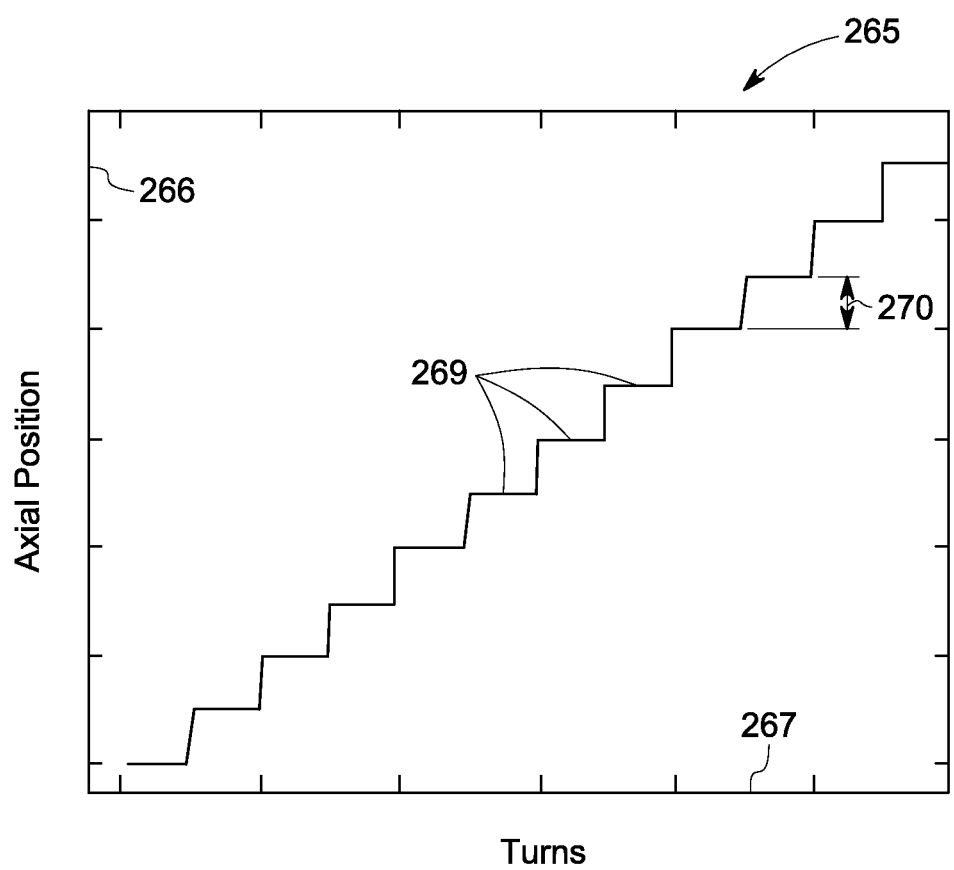
FIG. 17 is a graphical representation of a plurality of turn steps that produce the planar loops of FIG. 15, in accordance with aspects of the present disclosure.

FIG. 17 illustrates an enlarged view of the portion 265 of FIG. 16. As illustrated, the portion 265 is a summation of a plurality of turn steps 269. Each turn step 269 represents a turn or loop in the corresponding layer. Hence, each layer is made of a plurality of turn steps 269. Similarly, although not illustrated, the portion 268 (see FIG. 16) of the profile 264 is a summation of a plurality of turn steps that produce the planar loops illustrated in FIG. 15. Transition regions 270 between two consecutive turn steps result in an increase in the axial position of the wire.

Figure 18:
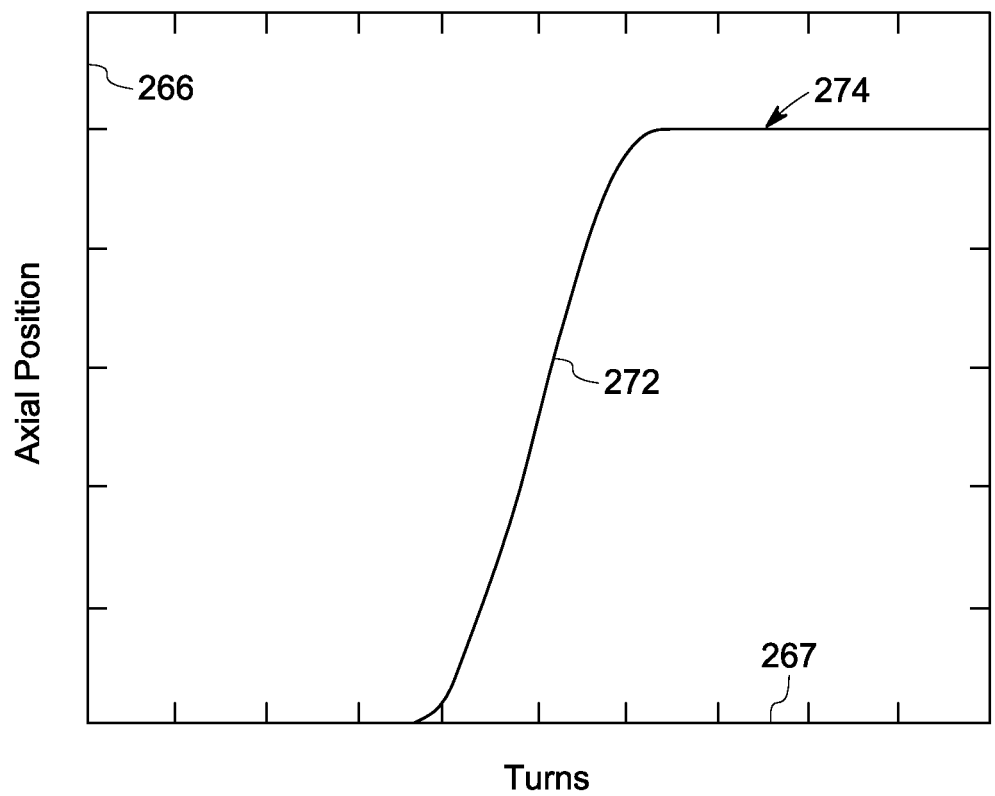
FIG. 18 is a graphical representation of transitions between two consecutive single-turn steps of FIG. 17, in accordance with aspects of the present disclosure.

Further, as illustrated in FIG. 18, transition regions 272 between two consecutive steps of the plurality of turn steps may follow a profile 274 with transition regions 272. The profile illustrated in FIG. 18 illustrates the axial motion that the wire position control system is required to follow to attain the desired winding geometry. In some embodiments, the profile 274 may be referred to as a reference trajectory. In some embodiments, the reference trajectory may be represented as a one-dimensional look-up table expressing axial positions for given values of the spindle rotation angle. The look-up table may be implemented in the controller unit. In some other embodiments, in place of or in addition to axial positions, radial positions of the wire may be considered for the reference trajectory.

In the illustrated embodiment of FIG. 18, the transition region 272 may include an S-shaped profile; however, other profiles are also possible. Non-limiting examples of such other profiles may include a linear profile, a cubic profile, a spline profile, or combinations thereof. In one embodiment, the S-shaped profile may be modeled as a raised-cosine, where the raised-cosine has parameters consistent with wire stiffness and a lower limit on a desirable bending radius of the wire in the transition region 272.

Figure 19:
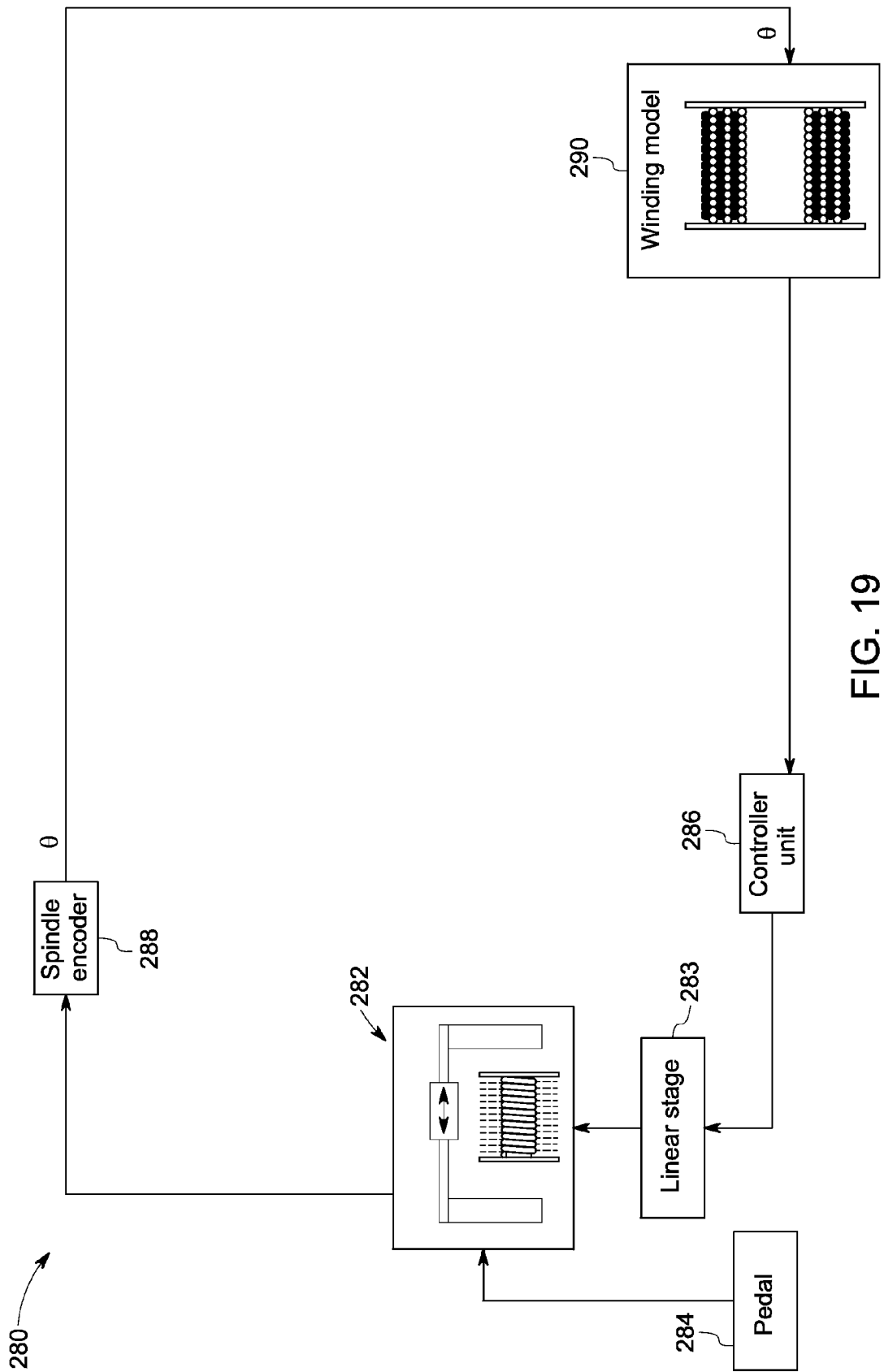
FIG. 19 is a block diagram of an example open-loop control system employing a wire disposing assembly, in accordance with aspects of the present disclosure.

FIG. 19 illustrates an example of an open loop feedback system 280 for precision magnetic coil winding. In the illustrated embodiment, the open loop system 280 may include a coil winding assembly, generally represented by reference numeral 282. The system 280 may further include a linear stage 283, a mechanical pedal 284 (e.g., a foot pedal), a controller unit 286, a spindle encoder 288, and a precision coil winding model unit 290.

In certain embodiments, the mechanical pedal 284 controls the speed of rotation of the spindle. The mechanical pedal 284 may be operated in a manual fashion or an automated fashion. The angle of rotation of the spindle (θ) is measured via the spindle encoder 288 (e.g., a quadrature encoder), and the value of the angle is used for interpolating the reference trajectory look-up table, yielding a desired axial position value (z) for the wire. The axial position of the wire is then achieved by the linear stage 283 upon receiving a command from the controller unit. In this mode, the system 280 acts to make a stage position match the theoretical position from the reference trajectory.

Furthermore, in some embodiments, the feedback process for the coil winding may include a closed-loop control method. In some embodiments, the closed-loop control method may employ a linear scanning profilometer device configured to sample an axial profile of the windings. Also, in some other embodiments, signal processing algorithms may be used to convert the axial wire profile information to a set of axial and radial coordinates corresponding to positions of successive turns on the wound coil. These positions of the successive turns on the wound coil may be fed back to the controller unit. The controller unit in turn adjusts the position of the microtraverser based on the input positions. The adjustment yields the desired wire position at each rotational increment, and ensures that the required number of turns is accommodated in the available coil length.

Additionally, in some embodiments, the profilometer is configured to facilitate detection of anomalous wire profiles that may indicate the presence of one or more winding defects in the coil. Such detection of anomalies in the wire profiles may be automated using signal processing algorithms that match the monitored profiles to hypothesized defect cases, or simply detect a pronounced deviation from a "normal" profile condition. Alternatively, the measured wire profile may be displayed as part of a graphical user interface (GUI) that is monitored and controlled by the operator. Visual and/or audible alarms may be produced to alert the operator to a potential defect condition, and permit timely correction. In the described manner, the winding is performed automatically, while an operator handles overall speed control and oversight of the process.

Figure 20:
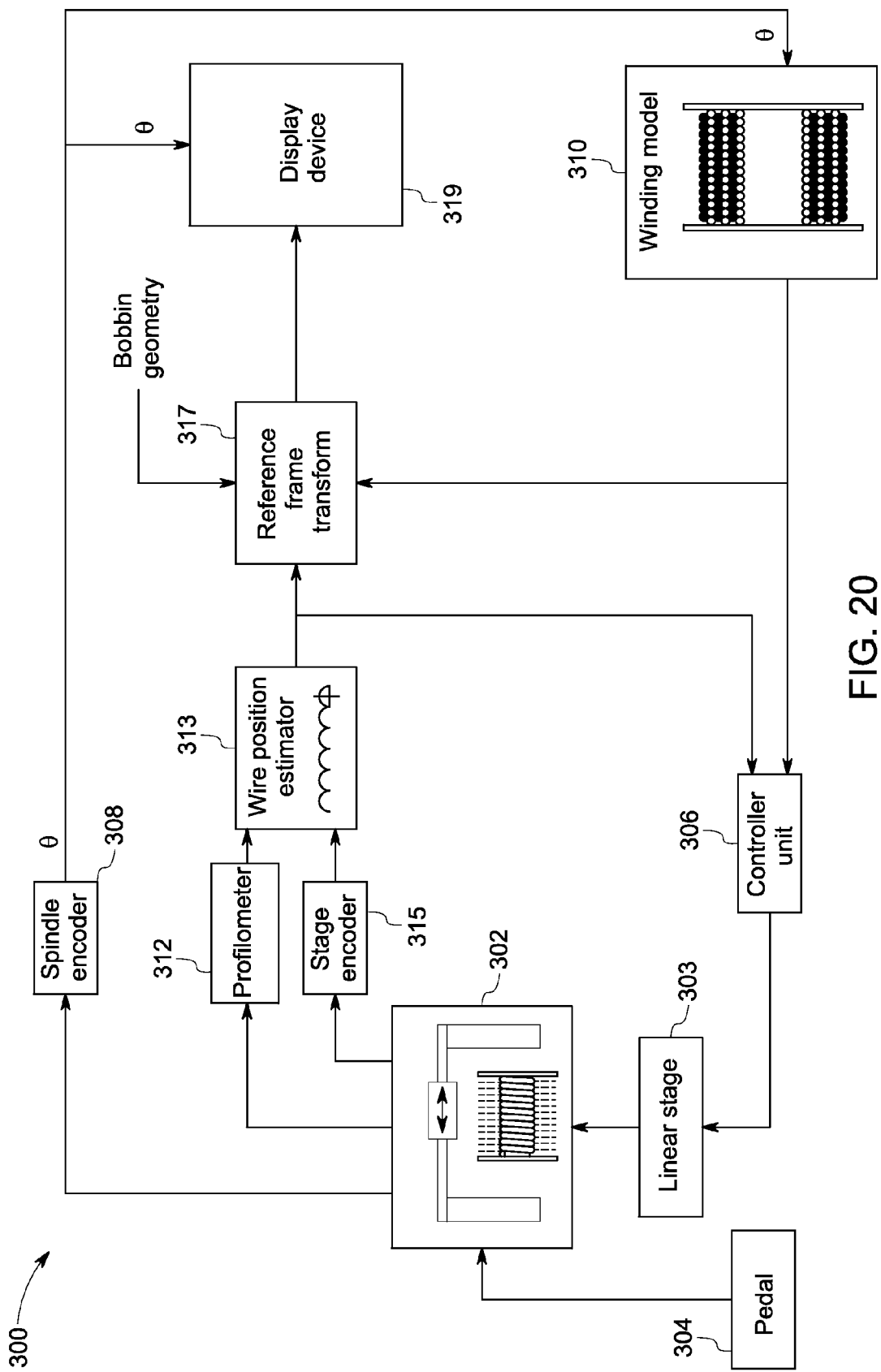
FIG. 20 is a block diagram of an example closed-loop control system employing a wire disposing assembly, in accordance with aspects of the present disclosure.

FIG. 20 illustrates an example of a closed-loop system 300 for making precision coil windings. In operation, the system 300 includes a supply source (not shown), a coil winding assembly, generally represented by reference numeral 302. The system 300 may further include a linear stage 303, a mechanical pedal 304, a controller unit 306, a spindle encoder 308, and a winding model unit 310. The supply source may be disposed on a supply stage. The controller unit 306 may be configured to axially position an incoming portion of the wire, where the controller unit 306 is also configured to provide reference trajectories for tracking. In this closed-loop mode, the system acts to make the measured wire position derived from the laser profilometer match the theoretical position from the reference trajectory. Active control of the stage is provided by a computer employing open-loop or closed-loop algorithms designed to achieve idealized coil geometry and to detect and correct defects.

The closed-loop system 300 further employs a wire profilometer 312 as part of a feedback unit. The profilometer 312 is used in conjunction with signal processing algorithms to infer a current position of a lead wire at the point where the wire contacts the spool.

In the illustrated embodiment of FIG. 20, feedback to the winding process in the closed-loop control scheme is facilitated by the profilometer 312 that provides a cross-sectional profile of the windings in the immediate vicinity of the wire being introduced. In one embodiment, a wire position estimator 313 is used to assess in real-time the position of the wire on the bobbin. The wire profilometer 312 is employed as a part of the controller unit 306 or a feedback unit. The feedback unit includes the spindle encoder 308 that is configured to provide data representative of an angular stage of the spindle. The wire position estimator 313 uses inputs from stage encoder 315, the profilometer 312 and signal processing algorithms to infer the current position of the lead wire at the point where the wire contacts the spool. In some embodiments, the profilometer 312, the stage encoder 315, and the wire position estimator 313 may form a monitoring unit. Using a reference frame transform 317, the estimation from the wire position estimator 313 may be compared with reference values of the trajectories. In one example, coordinates of the wire positions are compared to the estimated coordinates, and the real-time position of the wire may be displayed using a display device 319. Non-limiting examples of the display device may include a monitor or touch screen.

In certain embodiments, the signal processing algorithms reduce the profile information to a set of axial and radial coordinates corresponding to the positions of successive turns on the wound coil. These positions are fed back to the controller unit 306, which adjusts the position of the linear stage 303 in real-time. The adjustment yields the desired wire position at each rotational increment, and ensures that the required number of wire turns is accommodated in the available bobbin length.

Moreover, in some embodiments, a control algorithm compares the actual position of the wire to the desired position obtained from the spindle angle and reference trajectory look-up in the same manner as described hereinabove. Adjustments in the commanded stage position may be computed so as to minimize any difference between the desired positions obtained from the spindle angle and reference trajectory look-up in a minimal time. A real-time display of actual and desired wire position is provided for monitoring based on the wire position sensing capability. In one example, the display device 319 is configured to display three-dimensional digital quality images, measurements from auxiliary sensors, camera images, feedback data, or combinations thereof. The wire position estimator is used to assess in real-time the position of the wire on the bobbin. The coordinates of the positions are compared to the estimated coordinates, and the real-time position of the wire may be displayed using the display device 319.

Advantageously, the wire disposing assembly and system disclosed hereinabove facilitate reduction in winding defects while providing a time efficient winding process. By way of example, the assembly and system require less time relative to manual or semi-automatic winding processes that employ an operator to identify or determine a defect during winding of the coil.

While only certain features of the invention have been illustrated and described herein, many modifications and changes will occur to those skilled in the art. It should be noted that variations on main themes described above are possible. Non-limiting examples of such variations may include alternate hardware for actuation and sensing, alternate positioning measures (e.g., side loading), and possibly alternate workcell arrangements (e.g., coil form stationary and wire supply orbiting the outside). It is, therefore, to be understood that the appended claims are intended to cover all such modifications and changes as fall within the scope of the invention.

The invention claimed is:

1. A system configured to produce precision magnetic coil windings, comprising:
    a wire disposing assembly, comprising:
        a support configured to receive a plurality of turns of a wire, wherein the support is configured to rotate;
        an axial traverser sub-assembly operatively coupled to the support, wherein a rate of motion of the axial traverser sub-assembly is coupled to a speed of rotation of the support;
        a support arm comprising a wire disposing device configured to guide a portion of the wire being disposed on a surface of the support;
    a linear stage operatively coupled to the support arm;
    a monitoring unit; and
    a controller unit configured to axially position an incoming portion of the wire and provide reference trajectories for tracking.

2. The system of claim 1, wherein the monitoring unit comprises a feedback unit configured to provide a real-time feedback of a position of the wire on the support and a rotational position of the support.

3. The system of claim 2, and wherein the feedback unit comprises a stage encoder, a wire position estimator, a wire profiler, or combinations thereof.

4. The system of claim 2, wherein the feedback unit comprises a spindle encoder configured to provide data representative of an angular position of a spindle.

5. The system of claim 1, wherein the monitoring unit comprises one or more auxiliary sensors configured to sense one or more of a wire diameter, a wire length, a wire tension, or combinations thereof.

6. The system of claim 1, further comprising a display unit configured to display images representative of a position of the wire on the support, measurements from auxiliary sensors, camera images, feedback data, or combinations thereof.

7. The system of claim 1, further comprising a drive unit configured to control a rotational speed of the support, wherein the drive unit comprises encoders configured to monitor a shaft speed.

8. The system of claim 7, further comprising an actuating pedal configured to provide the rotational speed of the support.

9. The system of claim 7, wherein the drive unit is configured to automate the rotational speed of the support.

10. The system of claim 1, further comprising a resin unit configured to dispose resin on at least a portion of the wire.

11. A system configured to produce precision magnetic coil windings, comprising:
    a wire disposing assembly, comprising:
        a coil form;
        a frame configured to house the coil form;
        a radial positioning device operatively coupled to the frame and the coil form;
        a support arm, comprising:
            a wire disposing device configured to dispose at least a portion of a wire of the precision magnetic coil windings at a determined position on the coil form;
            a resin unit configured to dispose a determined amount of a resin on at least a portion of the wire prior to the wire being disposed on the coil form,
        wherein the radial positioning device is configured to maintain a determined distance from an end of the support arm to a surface of the coil form;
        a linear stage operatively coupled to the wire disposing device and the resin unit;
    a monitoring unit comprising a feedback unit operatively coupled to the wire disposing assembly and configured to provide feedback to the wire disposing assembly; and
    a controller unit operatively coupled to the wire disposing assembly and the feedback unit, wherein the controller unit is configured to control the wire disposing assembly.

12. The system of claim 11, wherein the radial positioning device comprises a radial support beam configured to provide support to the linear stage.

13. The system of claim 11, wherein the feedback unit comprises a profilometer configured to profile at least a portion of a coil winding.

14. The system of claim 11, wherein the controller unit is configured to provide a reference trajectory.

15. The system of claim 14, wherein the reference trajectory is generated using geometric models of a winding geometry.

16. The system of claim 11, further comprising one or more auxiliary sensors configured to sense one or more of a wire diameter, a wire length, shaft speed, a wire tension, or combinations thereof.

17. The system of claim 11, wherein the wire disposing device comprises a guiding wheel configured to guide at least a portion of the wire on the surface of the coil form.

18. The system of claim 11, wherein the resin unit comprises a dispensing device configured to provide a passage to a wire coated with a resin.

19. The system of claim 11, further comprising a display device configured to display three-dimensional digital images of at least a portion of the precision magnetic coil windings, measurements from auxiliary sensors, camera images, feedback data, or combinations thereof.

* * * * *